(12) United States Patent
Hanzawa et al.

(10) Patent No.: US 6,205,086 B1
(45) Date of Patent: Mar. 20, 2001

(54) PHASE CONTROL CIRCUIT, SEMICONDUCTOR DEVICE AND SEMICONDUCTOR MEMORY

(75) Inventors: Satoru Hanzawa, Hachiouji; Takeshi Sakata, Kodaira; Osamu Nagashima, Hamura, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/560,724

(22) Filed: Apr. 28, 2000

(30) Foreign Application Priority Data

Apr. 28, 1999 (JP) .................................................. 11-121211

(51) Int. Cl.⁷ ...................................................... G11C 8/00
(52) U.S. Cl. .......................... 365/233; 365/194; 327/153
(58) Field of Search ..................................... 365/233, 194; 327/153

(56) References Cited

U.S. PATENT DOCUMENTS

| 5,936,912 | * | 8/1999 | Kawabata et al. | .................. | 365/233 |
| 6,081,462 | * | 6/2000 | Lee | ..................................... | 365/194 |

FOREIGN PATENT DOCUMENTS

| 7106956 | 4/1995 | (JP) . |
| 878951 | 3/1996 | (JP) . |
| 8223031 | 8/1996 | (JP) . |
| 1013395 | 1/1998 | (JP) . |
| 10126254 | 5/1998 | (JP) . |
| 1124785 | 1/1999 | (JP) . |

OTHER PUBLICATIONS

Skew Minimization Techniques for 266M–bit Synchronous DRAM and beyond by: Jin–Man Han et al pp. 192–193, 1996.
ISSCC96/Session 23/DRAM/ Paper SP.23.4: A 2.5ns Clock Acess 250 Mb SDRAM with a Synchro Mirror Delay pp. 374–375, Feb. 10, 1996.
Capacitance coupled Bus with Negative Delay Circuit for High Speed and Low Power (10GB/s<500n Synchronous DRAMs by: Toshio Yamada et al., pp. 112–113, 1996.

* cited by examiner

Primary Examiner—Huan Hoang
(74) Attorney, Agent, or Firm—Antonelli, Terry, Stout & Kraus, LLP

(57) ABSTRACT

A phase control circuit comprises a plurality of fixed delay circuits (200-0 through 200-5) which assign different predetermined delay times to a first clock signal (BDA1) respectively, a detection circuit (201) which receives clock signals outputted from the plurality of fixed delay circuits and a second clock signal (PCLK) different in phase from the first clock signal therein and generates detected signals (202) represented in a plurality of bits each corresponding to the difference in phase between the first clock signal and the second clock signal, and a variable delay circuit (200-6) which gives a delay in the phase difference corresponding to each of the detected signals to a third clock signal (BDA2).

18 Claims, 13 Drawing Sheets

| P_Tr_Width | N_Tr_Width | Size |
|---|---|---|
| Wp0 | Wn0 | Max. |
| Wp1 | Wn1 | ↓ |
| Wp2 | Wn2 | |
| Wp3 | Wn3 | |
| Wp4 | Wn4 | |
| Wp5 | Wn5 | Min. |
| Wp6 | Wn6 | Ref_Size |

| | | N0 | N1 | N2 | N3 | N4 | N5 | |
|---|---|---|---|---|---|---|---|---|
| 200-0 | FTD0 | H | H | H | H | H | H | FAST(Max.) |
| 200-1 | FTD1 | L | H | H | H | H | H | ↓ |
| 200-2 | FTD2 | L | L | H | H | H | H | |
| 200-3 | FTD3 | L | L | L | H | H | H | |
| 200-4 | FTD4 | L | L | L | L | H | H | |
| 200-5 | FTD5 | L | L | L | L | L | H | SLOW |

LEVEL SIGNAL (H : HIGH, L : LOW)

FIG. 17A

|       | N0 | N1 | ... | N(t−1) | Nt | N(t+1) | ... | Ns |
|-------|----|----|-----|--------|----|--------|-----|----|
| FTD0  | L  | L  | ... | L      | L  | L      | ... | L  |
| FTD1  | H  | L  | ... | L      | L  | L      | ... | L  |
| ...   |    |    |     |        |    |        |     |    |
| FTD(t−1) | L | L | ... | H     | L  | L      | ... | L  |
| FTDt  | L  | L  | ... | L      | H  | L      | ... | L  |
| ...   |    |    |     |        |    |        |     |    |
| FTDs  | L  | L  | ... | L      | L  | L      | ... | H  |

H : SOURCE VOLTAGE LEVEL
L : GROUND VOLTAGE LEVEL

FIG. 17B

|       | N0 | N1 | ... | N(t−1) | Nt | N(t+1) | ... | Ns |
|-------|----|----|-----|--------|----|--------|-----|----|
| FTD0  | L  | L  | ... | L      | L  | L      | ... | L  |
| FTD1  | H  | L  | ... | L      | L  | L      | ... | L  |
| ...   |    |    |     |        |    |        |     |    |
| FTD(t−1) | H | H | ... | H     | L  | L      | ... | L  |
| FTDt  | H  | H  | ... | H      | H  | L      | ... | L  |
| ...   |    |    |     |        |    |        |     |    |
| FTDs  | H  | H  | ... | H      | H  | H      | ... | H  |

H : SOURCE VOLTAGE LEVEL
L : GROUND VOLTAGE LEVEL

PHASE CONTROL CIRCUIT, SEMICONDUCTOR DEVICE AND SEMICONDUCTOR MEMORY

BACKGROUND OF THE INVENTION

The present invention relates to a phase control technique, and a semiconductor device and a semiconductor memory activated in synchronism with a clock signal, and particularly to a phase control technique capable of controlling the phase of an internal clock signal synchronized with an externally-input clock signal so as to match an external output operation with the phase of the external clock signal. The present invention relates to a technique effective for application to a clock synchronous memory like an SDRAM (Synchronous Dynamic Random Access Memory), for example.

An SDRAM performs the input/output of data in synchronism with a clock signal inputted from the outside. When the operating frequency of the SDRAM is improved or made upward to shorten a clock cycle time, an access time required to read data according to its clock cycle must be shortened. Therefore, a phase control circuit or a clock reproducing circuit for reducing a clock skew between the external clock signal and an internal clock signal for data output control regardless of the frequency of the external clock signal, in other words, constantly matching the phase of the external clock signal with that of the internal clock signal for data output control has been adopted.

As conventional clock reproducing circuits, there are known those using PLL (Phase Locked Loop) and DLL (Delay Locked Loop). Since, however, they are feedback circuits, even a few hundred cycles are required to match the phase with a predetermined one, time is required to return them from a standby state to an operable state. Further, they must be always activated even during standby in order to avoid it, so that stand-by power increases.

Therefore, SMD (Synchronous Mirror Delay) has been proposed in International Solid-State Circuit Conference Digest of Technical Papers, pp. 374–375, February 1996 as a clock reproducing circuit capable of stopping its operation on standby. The SMD has a series of two delay circuits, i.e., a traveling-direction or forward delay circuit, a reverse or backward delay circuit, a mirror image control circuit and a delay monitor. The forward delay circuit and the backward delay circuit are placed in such a manner that signal transfer paths are opposite to each other. The outputs of respective delay stages of the forward delay circuit are respectively connected to the inputs of their corresponding delay stages of the backward delay circuit through the mirror image control circuit. The delay monitor is a dummy circuit for a delay time of a clock input buffer and a delay time of a clock driver. The operation of the SMD will be described in the above-described reference as will be described below. An nth clock first passes through the delay monitor and proceeds within the forward delay circuit up to the entrance of an n+1th clock into the mirror image control circuit. When the n+1th clock is inputted to the mirror image control circuit, the nth clock is transferred from the forward delay circuit to the backward delay circuit. The nth clock passes through the backward delay circuit substantially in the same time as when it has passed through the forward delay circuit, and is then inputted to the clock driver. As a result, the output of the clock driver supplied with the nth clock is different from an n+2th external clock in phase. That is, the time between the nth clock having passed through the delay monitor and the n+1th clock is measured as the number of stages of delay circuits, and they are further caused to pass through the delay circuits by the number of the stages, whereby an internal clock matched with the n+2th external clock in phase is generated. Accordingly, the SMD is capable of generating an internal clock matched with an external clock in phase in two clock cycles since the commencement of its operation.

The following is known as a reference in which another conventional clock reproducing circuit with no feedback circuit has been described. SMDs are disclosed even in Japanese Patent Application Laid-Open Nos. Hei 10(1998)-126254 and 8(1996)-223031. In addition to these, T. Yamada, et al., 1996 Symposium on VLSI Circuits Digest of Technical Papers, pp. 112–113, and Japanese Patent Application Laid-Open No. Hei 7(1995)-106956 are known.

In the SMD referred to above, the maximum error in phase synchronization between the external clock and the internal clock is equivalent to a delay time corresponding to one delay stage in each of the forward delay circuit and the backward delay circuit. Therefore, a clock reproducing circuit to which a fine-adjustment or -control circuit is added to minimize such an error, is known. Clock reproducing circuits each using SMD even for fine adjustment or control are disclosed in, for example, J. Han, et al., 1996 Symposium on VLSI Circuits Digest of Technical Papers, pp. 192–193, and Japanese Patent Application Laid-Open No. Hei 10(1998)-13395.

Further, Japanese Patent Application Laid-Open No. Hei 11(1999)-24785 discloses a circuit wherein lattice or grid-like delay circuits (SQUAD) in which logic gates whose two input terminals are respectively coupled to one another with capacitance, are placed in array form to thereby delay a clock signal, are provided for fine control or adjustment of each delay time, and other delay elements for achieving the enlargement of the delay control or adjustment are inserted in a previous stage, whereby an internal clock synchronism with an external clock can be formed. Its premise technique has been disclosed in Japanese Patent Application Laid-Open No. Hei 8(1996)-78951.

SUMMARY OF THE INVENTION

However, it has been revealed by the present inventors that the circuit using the SMD even for the fine control has a problem in that resolution cannot be improved as compared with unit delay times developed by unit delay circuits each comprised of logic gates corresponding to two stage, and the accuracy of adjusting or controlling each delay time cannot be improved in proportion to its complex configuration. Further, the present inventors have found out another problem in that when the grid-like delay circuits (SQUAD) are used for fine control of each delay time, the number of circuit elements increases, and a plurality of delay stages are required to stably generate a high-resolution minute delay, so that a measurable clock cycle time cannot be shortened.

An object of the present invention is to provide a phase control circuit simple in circuit configuration as compared with a configuration using SMD and grid-like delay circuits (SQUAD) for fine control of delay times, and a clock reproducing circuit.

Another object of the present invention is to provide a phase control circuit capable of shortening a measurable clock cycle time, in other words, achieving an improvement in the frequency of a phase-controllable clock signal as compared with a configuration using SMD and grid-like delay circuits (SQUAD) for fine control of delay times, and a clock reproducing circuit.

A further object of the present invention is to reduce power consumption of a semiconductor device activated in synchronism with a clock signal.

A still further object of the present invention is to provide a semiconductor device for performing the input and output of data in synchronism with an external clock signal, which is capable of widening a shortened width of a clock cycle time with an improvement in operating frequency, and a semiconductor memory.

The above and other objects and novel features of the present invention will become apparent from the description of the present specification and the accompanying drawings.

Summaries of typical ones of the invention disclosed in the present application will be described in brief as follows:

[1]

According to the invention as viewed from the aspect of a phase control circuit, a phase control circuit (94) is implemented by a plurality of fixed delay circuits (200-0 through 200-5) which respectively receive a first clock signal (BDA1) therein and add predetermined delay times different from one another to the input first clock signal, a detection circuit (201) which receives clock signals outputted from the plurality of fixed delay circuits and a second clock signal different in phase from the first clock signal therein and generates detected signals (202) represented in a plurality of bits each corresponding to the difference in phase between the second clock signal (PCLK) and the first clock signal, and a variable delay circuit (200-6) which receives the detected signals outputted from the detection circuit in parallel therein and gives a delay associated with the phase difference corresponding to each input detected signal to a third clock signal (BDA2). According to the phase control circuit, the simple use of one variable delay circuit with respect to the plurality of fixed delay circuits makes it possible to perform phase control with the number of tones or gradations or resolution corresponding to the number of the fixed delay circuits. Thus, a circuit configuration can be simplified as compared with the case in which SMD and grid-like delay circuits (SQUAD) are used for fine control or adjustment of each delay time. Since the circuit configuration becomes simple, a measurable clock cycle time can be shortened as compared with the use of the SMD and grid-like delay circuits (SQUAD). That is, a phase-controllable operating frequency can be improved with high accuracy.

The fixed delay circuits and the variable delay circuit can be respectively implemented by current control type inverters (IV0 and IV1) whose operating currents are determined according to switched states of current source transistors (Wp0 through Wp6 and Wn0 through Wn6). The variable delay circuit includes the current source transistors in parallel in plural form. The plurality of current source transistors are respectively switch-controlled according to the detected signals represented in the plurality of bits. Since the delay times are determined under the control of the operating currents, the minimum value of a controllable delay time width can be further reduced as compared with the case in which each delay time is controlled by the number of the series stages of inverters.

The use of capacitive elements (C0 through Cs) for the control of each delay time is also similar to the above. That is, the fixed delay circuits and the variable delay circuit are respectively provided with capacitive elements within signal transfer paths through switch transistors (M0 through Ms). The variable delay circuit includes the capacitive elements and switch transistors in parallel in plural form. The plurality of switch transistors are respectively switch-controlled based on the detected signals represented in the plurality of bits.

There is provided a latch circuit (CIV11, CIV12, NAND13) which latches the detected signals for each period greater than one cycle of the second clock signal and supplies the same to the variable delay circuit. Thus, the operation of detecting the phase difference by the detection circuit can be also performed intermittently. This contributes to low power consumption.

Assuming that the first clock signal is a clock signal obtained by adding a first delay time (td1+td3) and a second delay time to the second clock signal, the third clock signal becomes a clock signal obtained by adding the second delay time to the second clock signal. According to this relationship, if the first delay time is produced by a dummy circuit for simulating an operation delay time of an input circuit (2) for receiving an external clock signal therein, an operation delay time of an output circuit for performing an output operation in phase with the external clock, etc., and a delay time developed by another delay element circuit (101) is set as a second delay time (tD×n), then the output circuit, which receives the output clock signal of the variable delay circuit therein, is capable of output operation in accordance with the phase of the external clock signal. The variable delay circuit makes the unit for control or adjustment of the delay time added to the third clock signal smaller than the unit for setting the delay time of another delay element circuit. As a result, the phase matching between the output operation of the output circuit and the external clock signal can be brought into higher accuracy.

A semiconductor device (1) which has adopted the above-described phase control circuit comprises a semiconductor chip which includes a clock terminal which receives an external clock signal therein, a clock input circuit (2) connected to the clock terminal, the phase control circuit (9) connected to the clock input circuit, a data output circuit (10) connected to the phase control circuit, and data terminals which are connected to the data output circuit and used to output data to the outside. The second clock signal is a clock signal delayed a predetermined time with respect to the external clock signal. The data output circuit is a circuit which outputs the data in phase with the external clock signal in synchronism with the signal outputted from the variable delay circuit in the phase control circuit.

The data output circuit may output a data strobe signal (DQS) in phase with the external clock signal in synchronism with the signal outputted from the variable delay circuit in the phase control circuit. The design or the like of a system becomes easier by supplying such a strobe signal to a circuit for obtaining access to the semiconductor device.

[2]

A semiconductor device according to another specific aspect of the present invention has a clock reproducing circuit (9) which adopts the phase control circuit for the purpose of fine control or adjustment of phase control and adopts SMD as a circuit for widening its control width. That is, the semiconductor device includes a clock input circuit (2) which receives an external clock signal therein to thereby generate an internal clock signal, an internal circuit (3) activated in synchronism with the internal clock signal, an output circuit (10) which outputs the result of operation of the internal circuit to the outside, and a clock reproducing circuit (9) for matching the phase of output operation by the output circuit with that of the external clock signal. The clock reproducing circuit includes first and second predetermined delay circuits (91, 92) which respectively add predetermined delay times to a reference clock signal synchronized with the internal clock signal and are connected to each other in series form, a phase difference detection circuit (100) which detects the difference in phase between the output of the second predetermined delay circuit and the reference clock signal (PCLK), a first phase difference reproduction circuit (101) which gives the phase difference detected by the phase difference detection circuit to an output clock signal (NDMY) of the first predetermined delay circuit, a plurality of fixed delay circuits (200-0 through 200-5) which respectively receive a first clock signal (BDA1) outputted from the first phase difference reproduction circuit therein and add predetermined delay times different from one another to the input first clock signal, a detection circuit (201) which receives clock signals outputted from the plurality of fixed delay circuits and the reference clock signal therein and generates detected signals represented in plural bits each corresponding to the difference in phase between the reference clock signal and the first clock signal, a second phase difference reproduction circuit (102) which adds the phase difference detected by the phase difference detection circuit to the reference clock signal, and a variable delay circuit (200-6) which receives the detected signals in parallel from the detection circuit and adds a delay in the phase difference corresponding to each input detected signal to a clock signal (BDA2) outputted from the second phase difference reproduction circuit. The output circuit matches the phase of the output operation with that of the external clock signal (EX-CLK) in synchronism with a clock signal (SDCLK) outputted from the variable delay circuit. Thus, since the phase control is done in two stages of coarse control and fine control, a comparatively wide phase adjustment or control range can be ensured even if the number of tones or gradations for adjustments or control by the fine-control circuit (94) comprised of the fixed delay circuits and the variable delay circuit for performing the fine control is reduced. Further, it can be achieved on a small circuit scale as described above.

The first predetermined delay circuit can be comprised of a dummy circuit used for a delay time, which has a signal propagation delay time corresponding to a delay time equal to the sum of an operation delay time during which the clock input circuit generates the internal clock signal from the external clock signal and generates the reference clock signal from the internal clock signal, and an operation delay time during which the output clock signal of the variable delay circuit is inputted to allow the output circuit to perform the output operation.

If, at this time, the second predetermined delay circuit is comprised of a circuit having a delay time smaller than the maximum control width of a delay time capable of being supplied from the variable delay circuit, then the control or adjustment width of each delay time by the variable delay circuit becomes large so that the operating band of the external clock signal can be easily widened to the high-frequency side.

Described more specifically, each of the phase difference detection circuit and the first and second phase difference reproduction circuits, which are circuit units for performing the coarse control or adjustment, can be configured using SMD. That is, the phase difference detection circuit (100) can be implemented as a forward delay circuit for successively propagating the output of the second predetermined delay circuit, which has a plurality of unit delay circuits (110) provided in series form and selects the position of an output of each unit delay circuit, which most approximates the state of the reference clock signal. The first phase difference reproduction circuit (101) can be implemented as a first backward delay circuit which has a plurality of unit delay circuits (120) provided in series form in the reverse direction, each having a delay characteristic identical to or substantially identical to that of the forward delay circuit and which selects an input position of each of the unit delay circuits having, at a subsequent stage, the same number of stages as the number of stages of the unit delay circuits each corresponding to the output position selected by the forward delay circuit and adds the output of the first predetermined delay circuit to the selected input position. The second phase difference reproduction circuit (102) can be implemented as a second backward delay circuit which has a plurality of unit delay circuits (140) provided in series form in the reverse direction, each having a delay characteristic identical to or substantially identical to that of the forward delay circuit and which selects an input position of each of the unit delay circuits having, at a subsequent stage, the same number of stages as the number of stages of the unit delay circuits each corresponding to the output position selected by the forward delay circuit and adds the reference clock signal to the selected input position.

Each of the fixed delay circuits and the variable delay circuit can adopt a configuration using the current control type inverters or the capacitive elements as described above.

If a first latch circuit (103) which latches the phase difference detected by the phase difference detection circuit for each period greater than one cycle of the second clock signal and supplies the same to the second phase difference reproduction circuit, and a second latch circuit (CIV11, CIV12, NAND13) which latches the detected signals outputted from the detection circuit in synchronism with the latch operation of the first latch circuit and supplies the same to the variable delay circuit, are adopted, then a phase-different detecting operation can be intermittently performed so as to contribute to the achievement of low power consumption.

[3]

The semiconductor device can be applied to a clock synchronous semiconductor memory such as an SDRAM or the like. According to the semiconductor memory, a lock operating time required to synchronize an internal clock with an external clock can be shortened as compared with PLL and DLL. A circuit configuration for clock reproduction can be simplified and power consumption can be reduced. Further, the shortened width of a clock cycle time with an improvement in operating frequency can be widened.

[4]

A signal generating circuit according to a further aspect of the present invention comprises a control circuit (200-0 through 200-5, 201) which compares each of a plurality of signals (NFTD0 through NFTD5) different in change timing from one another and a signal (PCLK) in a predetermined cycle of a reference clock signal (DCLK) to thereby output each detected signal, and an output circuit (200-6) which outputs a signal (SDCLK) corresponding to the reference clock signal, based on the detected signal. The signal generating circuit has a plurality of delay circuits (200-0 through 200-6) respectively provided with delay time control units (Wp0 through Wp6, Wn0 through Wn6). Each individuals (200-6) of the plurality of delay circuits are first delay circuits provided within the output circuit. The plurality of other delay circuits excluding the plurality of first delay circuits are a plurality of second delay circuits (200-0 through 200-5) provided within the control circuit. The plurality of second delay circuits respectively output the plurality of signals (NFTD0 through NFTD5) different in change timing from one another in response to a common input signal (BDA1). Each of delay adjustment or control units (Wp0 through Wp6, Wn0 through Wn6 of 200-6) of the first delay circuit is variably controlled based on each detected signal. Thus, a circuit configuration can be simplified as compared with the case in which SMD and grid-like delay circuits (SQUAD) are used for fine adjustment or control of each delay time, and a phase-controllable operating frequency can be improved with high accuracy.

When the plurality of delay circuits have main delay units (IV0, IV1) with respect to the delay control units respectively, delay times of the respective delay circuits are respectively set by the main delay units and the delay control units.

When the signal generating circuit is included in a semiconductor device, the semiconductor device includes a clock terminal to which an external clock signal (EX-CLK) is inputted from outside the semiconductor device, data terminals (DQS, DQn) which output data to the outside of the semiconductor device, and a data output circuit (10) connected to the data terminals. The reference clock signal (DCLK) is a signal corresponding to the external clock signal (EX-CLK). The data output circuit responds to the signal (SDCLK) outputted from the output circuit of the signal generating circuit and outputs the data with timing synchronized with the external clock signal.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 17A and 17B are respectively explanatory diagrams illustrating the states of switching transistors for obtaining delay times respectively different with respect to a plurality of fixed delay circuits each of which has adopted such a configuration as shown in FIG. 16.

DESCRIPTION OF THE PREFERRED EMBODIMENT

<<Clock Reproducing Circuit>>

Figure 1:
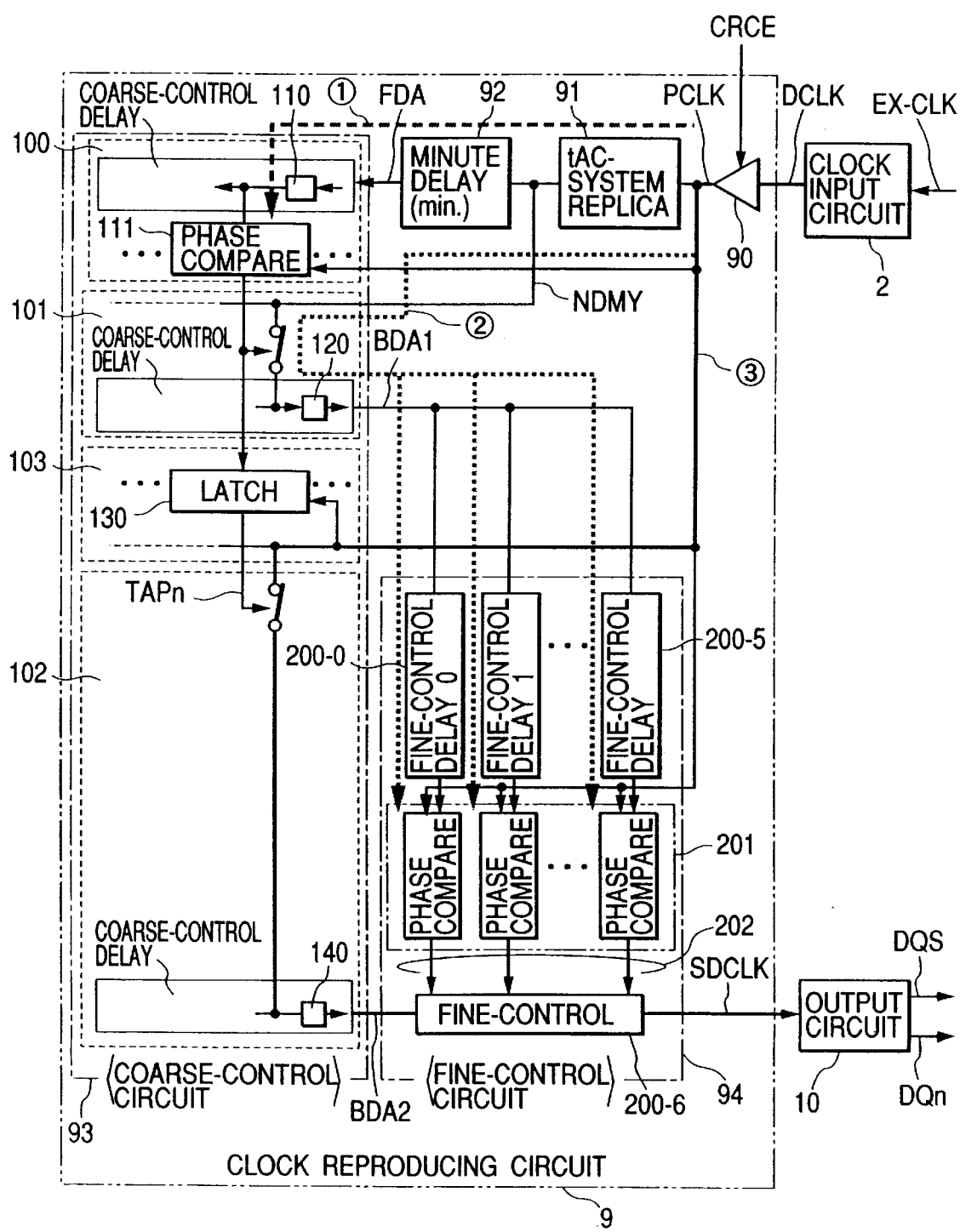
FIG. 1 is a block diagram showing a clock reproducing circuit illustrative of one example of a phase control circuit according to the present invention.

FIG. 1 shows a clock reproducing circuit which is one example of a phase control circuit according to the present invention. The clock reproducing circuit shown in FIG. 1 is applied to a semiconductor device shown in FIG. 2.

Figure 2:
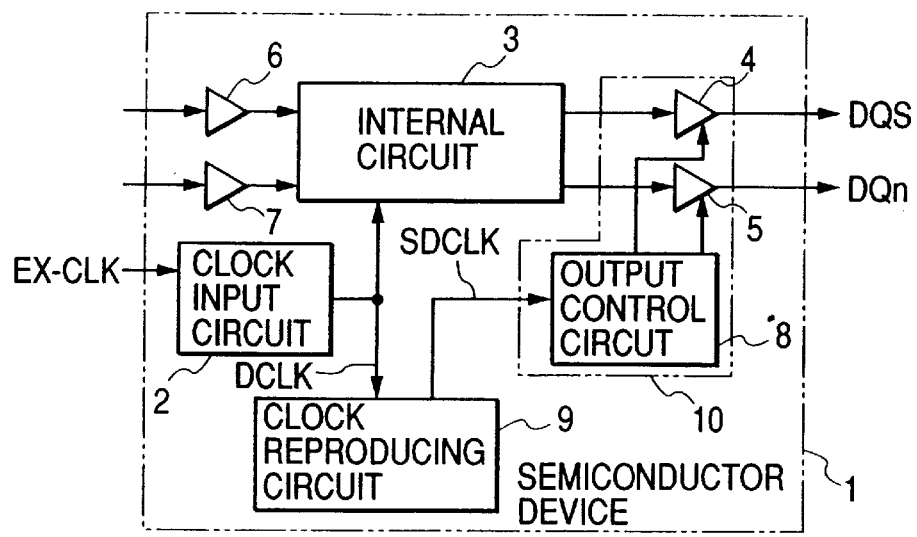
FIG. 2 is a block diagram illustrating one example of a semiconductor device to which the clock reproducing circuit shown in FIG. 1 is applied.

The semiconductor device 1 shown in FIG. 2 has a clock input circuit 2 for receiving an external clock signal EX-CLK therein to thereby generate an internal clock signal DCLK, an internal circuit 3 activated in synchronism with the internal clock signal DCLK, output buffers 4 and 5 for respectively outputting the results of operation of the internal circuit 3 outside, input buffers 6 and 7 for inputting data or the like to the internal circuit, an output control circuit 8 for controlling output operations of the output buffers 4 and 5, and a clock reproducing circuit 9 for synchronizing the phase of each of output operations carried out by the output control circuit 8 through the output buffers 4 and 5 with that of the external clock signal EX-CLK. Although not restricted in particular, those circuits are formed over a single semiconductor substrate like monocrystalline silicon. The output control circuit 8 and the output buffers 4 and 5 constitute an output circuit 10 for outputting the results of operation of the internal circuit 3 to the outside.

The clock reproducing circuit 9 shown in FIG. 1 has a clock buffer 90, a first predetermined delay circuit 91, a second predetermined delay circuit 92, a coarse-adjustment or control circuit 93 and a fine-adjustment or control circuit 94.

The clock buffer 90 receives the internal clock signal DCLK therein and outputs a reference clock signal PCLK having a phase slightly delayed with respect to the internal clock signal DCLK. A control signal CRCE is an enable signal of the clock reproducing circuit 9 and is supplied to a control terminal of the clock buffer 90. The clock buffer 90 outputs the reference clock signal PCLK when the enable signal CRCE is brought to a high level, thereby allowing the clock reproducing circuit 9 to operate. When the enable signal CRCE is low in level, the output of the clock buffer 90 is fixed to, for example, a low level, so that the clock reproducing circuit 9 is deactivated. When, for example, instructions for a standby state or a constant power consumption state are given to the semiconductor device 1, the enable signal CRCE is brought to the low level in response to it.

The first predetermined delay circuit 91 is a circuit for giving each prescribed delay time to the reference clock signal. Described in detail, the first predetermined delay circuit 91 is comprised of a dummy circuit provided for delay times having a signal propagation delay time equivalent to a delay time corresponding to the sum of an operation delay time (td1) from the input of an external clock signal to the clock input circuit 2 to the generation of an internal clock signal DCLK and an operation delay time (td2) from the input of an output clock signal SDCLK of the fine-control circuit 94 to the output circuit 10 to the output operation of the output circuit 10 and an operation delay time (td3) of the clock buffer 90. The delay times td1+td2 are equivalent to an access cycle time (tAC) at the time that when the semiconductor device is a memory, it does not perform clock reproduction control to be described from now on. The first predetermined delay circuit 91 will also be called "tAC-system delay-time replica circuit (tAC-system replica circuit)" for convenience's sake.

The second predetermined delay circuit 92 is comprised of a circuit having a delay time smaller than a delay time held by the fine-control circuit in maximum control or adjustment width. The second predetermined delay circuit 92 will also be called "fine or minute delay circuit".

The coarse-control circuit 93 comprises a phase difference detection circuit 100 for detecting the difference in phase between an output FDA of the second predetermined delay circuit 92 and the reference clock signal PCLK, a first phase difference reproduction circuit 101 for adding the phase difference detected by the phase difference detection circuit 100 to an output clock signal NDMY of the first predetermined delay circuit 91, a second phase difference reproduction circuit 102 for giving the phase difference detected by the phase difference detection circuit 100 to the reference clock signal PCLK, and a first latch circuit 103 for latching the phase difference detected by the phase difference detection circuit 100 for each period greater than or equal to one cycle of the reference clock signal PCLK and supplying it to the second phase difference reproduction circuit 102.

The phase difference detection circuit 100 has a plurality of unit delay circuits 110 provided in series form, which allow the output FDA of the second predetermined delay circuit 92 to successively propagate. They can be implemented as traveling-direction or forward delay circuits for respectively selecting the positions of outputs of the unit delay circuits 110 by phase comparators 111, which most approximate to the state of the reference clock signal PCLK.

Figure 3A:
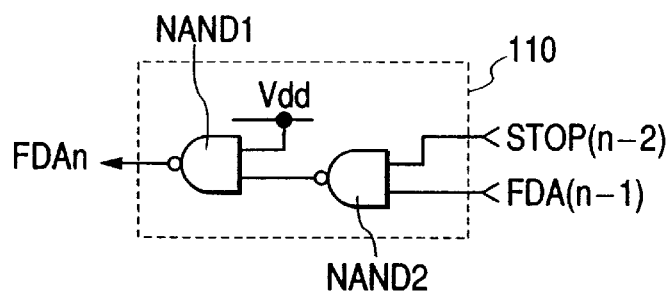
FIGS. 3A and 3B are logical circuit diagrams respectively showing a unit delay circuit included in a phase difference detection circuit and a unit delay circuit included in a first phase difference reproduction circuit.

As shown in FIG. 3A by way of example, the unit delay circuit 110 can be comprised of two two-input NAND gates NAND1 and NAND2 connected in series. In FIG. 3A, FDAn indicates an output node, FDA(n−1) indicates an output node of a previous stage, and STOP(n−2) indicates an output node of a further previous-stage phase comparator.

Figure 4:
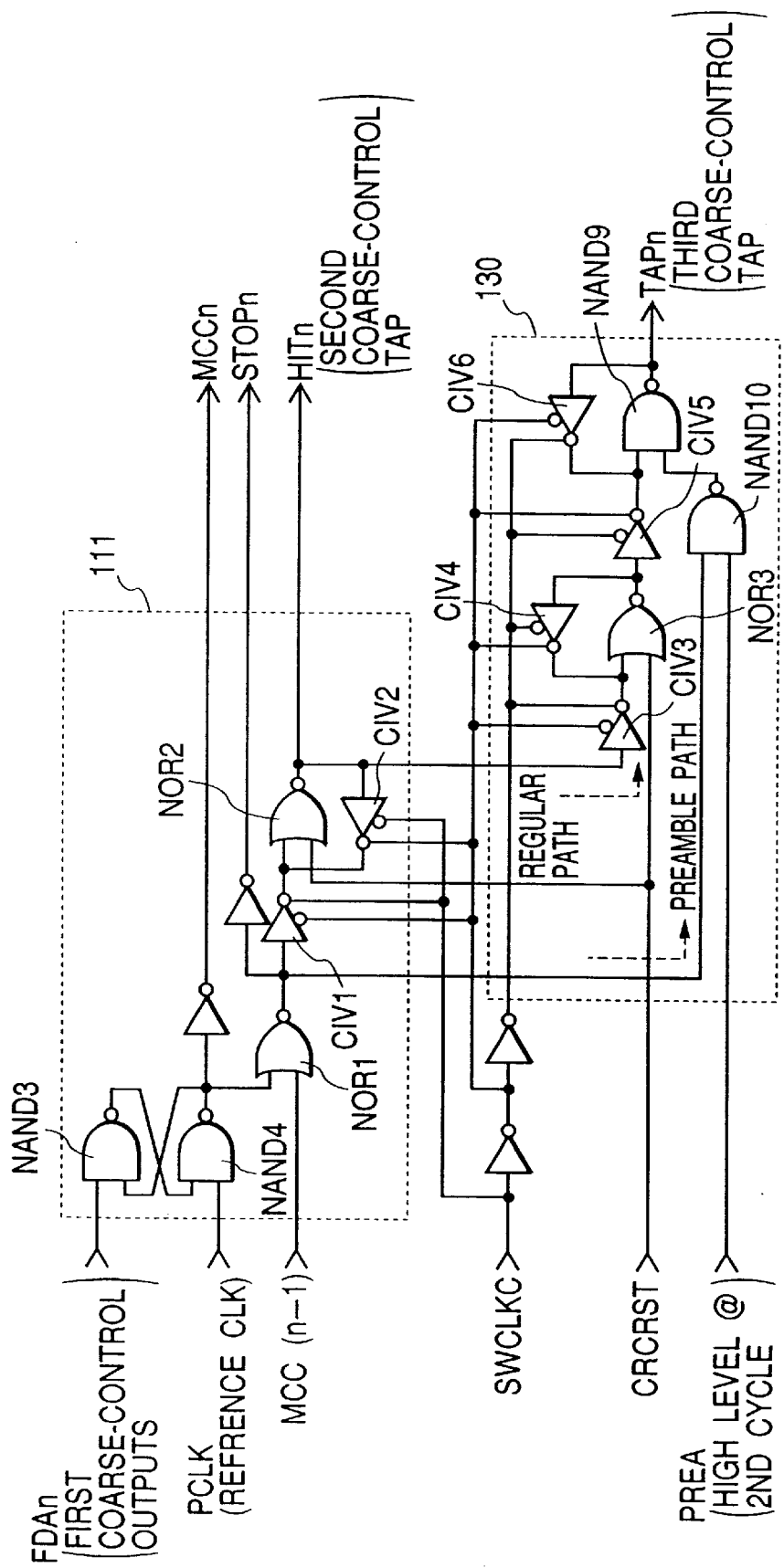
FIG. 4 is a logical circuit diagram depicting one example illustrative of a phase comparator and a latch 130 included in the phase difference detection circuit.

The phase comparators 111 are placed in array form one by one with respect to output nodes of the unit delay circuits 110 respectively. The phase comparator 111 is configured as shown in FIG. 4 by way of example. The output of one NAND gate of two two-input NAND gates NAND3 and NAND4 is mutually feedback-connected to the input of the other NAND gate thereof. If the output (FDAn) of each unit delay circuit 110, which performs correspondence with timing of the rising edge of a reference clock signal PCLK, is of a high level, then the output of an NOR gate NOR1 is brought to a high level. The output of the NOR gate NOR1 is outputted as a high-level comparison result signal HITn via a static latch comprised of a clocked inverter CIV1 for an input gate, a NOR gate NOR2 and a feedback clocked inverter CIV2. Although not restricted in particular, the static latch comprised of the clocked inverter CIV1, NOR gate NOR2 and clocked inverter CIV2 performs a latch operation in synchronism with a clock signal SWCLK. When the static latch performs the latch operation each time in synchronism with the reference clock signal PCLK, SWCLKC can be set as PCLK. When the static latch performs the latch operation once per eight cycles of PCLK, a signal for outputting PCLK once per eight cycles according to a phase comparing operation may be set as SWCLKC. Further, STOPn is generated from the output of the NOR gate NOR1 through the inverter. When HITn is of a high level, for example, STOPn low in level is inputted to the unit delay circuits subsequent to the second stage of the unit delay circuits 110 and hence the propagation of the clock through the unit delay circuits 110 is stopped.

The latch circuit 103 has latches 130 placed in a one-to-one correspondence with the phase comparators 111 placed in array form. One example of the latch 130 is shown in FIG. 4. The latch 130 latches a high-level comparison result signal HITn through the use of a pre-stage static latch comprised of a clocked inverter CIV3 for an input gate, a NOR gate NOR3 and a feedback clocked inverter CIV4, and a post-stage static latch comprised of a clocked inverter CIV5 for an input gate, a NAND gate NAND9 and a feedback clocked inverter CIV6. Although not restricted in particular, the latch is controlled based on the clock signal SWCLKC. The determination of an output signal TAPn through the series two-stage static latches is delayed once cycle of the reference clock signal PCLK with respect to the determination of the phase comparison result signal HITn. Although not restricted in particular, a DDR (Double Data Rate) SDRAM has specifications that data is outputted on both the rising and falling edges of a clock signal and a data output terminal is forcefully set to a low level before one cycle in which the first or initial data output is started from the issuance of a read command. In order to cope with it, the latch 130 shown in FIG. 4 is capable of forcefully setting a signal PREA to a high level in the second cycle of the reference clock signal PCLK after the read command and outputting a signal outputted from the NOR gate NOR1 as TAPn therefrom via a NAND gate NAN10 responsive to the signal PREA prior to one cycle. CRCRST indicates a reset signal for the static latch.

Figure 3B:
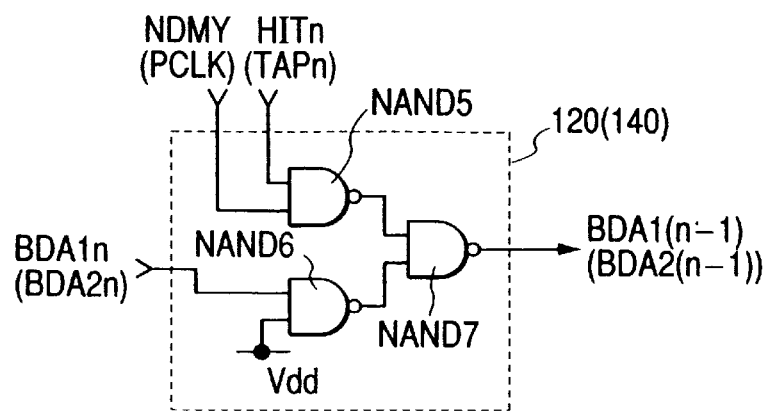

The first phase difference reproduction circuit 101 is implemented as a first reverse or backward delay circuit which has a plurality of unit delay circuits 120 provided in series form in the reverse direction, each having a delay characteristic identical to or substantially identical to that of the forward delay circuit and which selects an input position of each of the unit delay circuits having, at a subsequent stage, the same number of stages as the number of stages of the corresponding unit delay circuits each corresponding to the output position selected by the forward delay circuit and gives the output NDMY of the first predetermined delay circuit 91 to the selected input position. In FIG. 1, a selection node at the input position of the unit delay circuit 120 is typically illustrated like a switch. An example of a circuit which constitutes the unit delay circuit 120 together with the selection node, is shown in FIG. 3B. The unit delay circuit 120 comprises, for example, three NAND gates NAND5 through NAND7. The NAND gate 5 functions as a selection gate (corresponding to the switch typically illustrated in FIG. 1) for selecting an output signal NDMY of the first predetermined delay circuit 91 in response to a high level of a corresponding phase comparison result signal HITn. BDA1(n−1) indicates an output node of each unit delay circuit 120, and BDA1(n) indicates an output node of a pre-stage unit delay circuit 120.

The second phase difference reproduction circuit 102 is implemented as a second reverse or backward delay circuit which has a plurality of unit delay circuits 140 provided in series form in the reverse direction, each having a delay characteristic identical to or substantially identical to that of the forward delay circuit 100 and which selects, based on the latch signal TAPn, an input position of each of the unit delay circuits 140 having, at a subsequent stage, the same number of stages as the number of stages of the corresponding unit delay circuits each corresponding to the output position selected by the forward delay circuit 100 and adds the reference clock signal PCLK to the selected input position. In FIG. 1, a selection node at the input position of the unit delay circuit 140 is typically illustrated like a switch. The same circuit configuration as that shown in FIG. 3B can be adopted for the unit delay circuit 120. The NAND gate 5 serves as a selection gate (corresponding to the switch typically illustrated in FIG. 1) for selecting the reference clock signal PCLK in response to a high level of a corresponding latch signal TAPn. BDA2(n−1) indicates an output node of each unit delay circuit 140, and BDA2(n) indicates an output node of a pre-stage unit delay circuit 140.

As shown in FIG. 1 by way example, the fine-control circuit 94 comprises plural, e.g., six fixed delay circuits 200-0 through 200-5 for respectively inputting or receiving a first clock signal BDA1 outputted from the first phase difference reproduction circuit 101 and giving different predetermined delay times to the input first clock signal BDA1, a detection circuit 201 for receiving clock signals outputted from the plurality of fixed delay circuits and the reference clock signal PCLK therein and generating detected signals 202 represented in the form of a plurality of bits, corresponding to phase differences between the reference clock signal PCLK and the first clock signals BDA1, and a variable delay circuit 200-6 for receiving the plural bits-based detected signals 202 from the detection circuit 201 in parallel and supplying delays in the phase differences corresponding to the input detected signals 202 to a clock signal BDA2 outputted from the second phase difference reproduction circuit 102.

Figure 5:
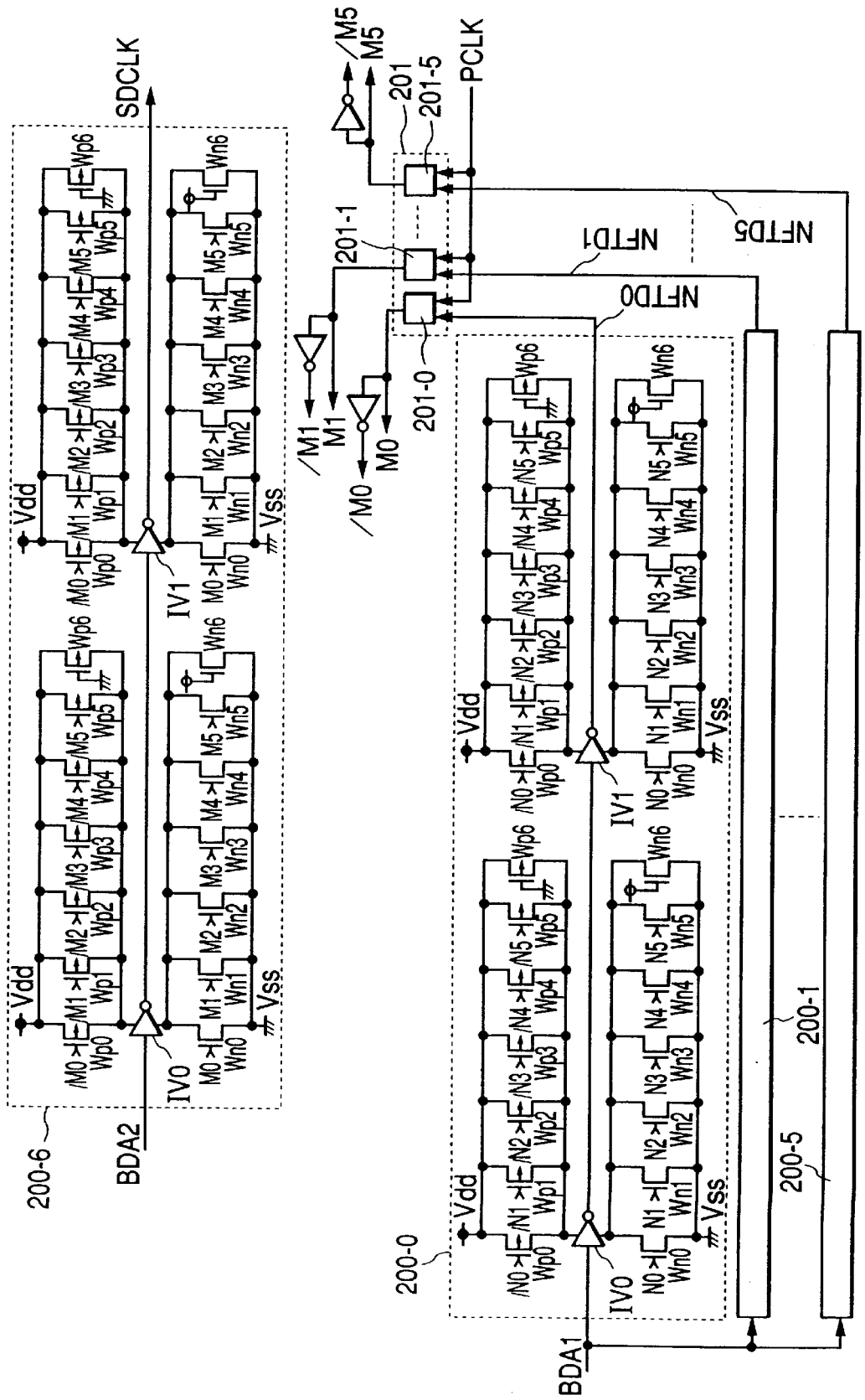
FIG. 5 is a circuit diagram illustrating a detailed one example of a fine-control circuit shown in FIG. 1.

A detailed example of the fine-control circuit 94 is shown in FIG. 5. The fixed delay circuits 200-0 through 200-5 and the variable delay circuit 200-6 are respectively implemented by current control type inverters IV0 and IV1 wherein operating currents are determined according to switched states of a plurality of p channel type current source transistors Wp0 through Wp6 and a plurality of n channel type current source transistors Wn0 through Wn6. In particular, the gate electrodes of the current source transistors Wp0 through Wp6 and Wn0 through Wn6 in the fixed delay circuits 200-0 through 200-5 are respectively fixed to a source voltage Vdd and a ground voltage Vss according to delay times to be set thereto.

Since all the current source transistors sharing the use of drains in the fixed delay circuits 200-0 through 200-5 and the variable delay circuit 200-6 are not brought to an off state from the viewpoint of operation, one current source transistor Wp6 is always set to an on state on the source voltage Vdd side, and one current source transistor Wn6 is always set to an on state on the ground voltage Vss side.

Figures 6, 7, 8:
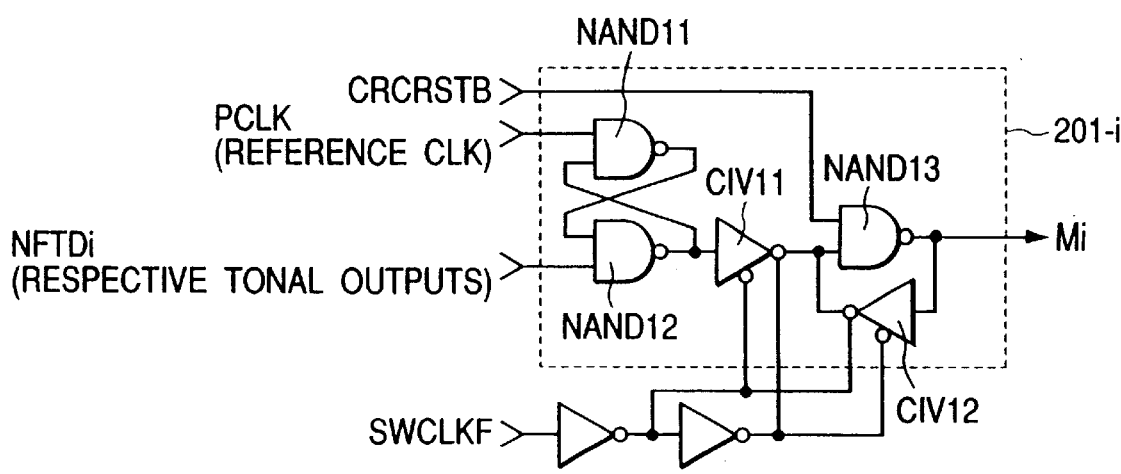
FIG. 6 is an explanatory diagram showing the relations in sizes of respective current source transistors which constitute fixed and variable delay circuits.
FIG. 7 is an explanatory diagram illustrating modes of switched states of current source transistors which constitute a plurality of fixed delay circuits.
FIG. 8 is a logical circuit diagram showing in detail a phase comparator of a detection circuit included in the fine-control circuit.

The sizes (gate widths) of the current source transistors Wp0 through Wp6 may be identical to one another. Alternatively, weights equivalent to two factorial are applied to them and they may successively be set large or small. The n channel type current source transistors Wn0 through Wn6 are also similar to the above. As shown in FIG. 6 by way of example, the sizes (gate widths) of the current source transistors Wp0 through Wp6 are successively reduced. Similarly, the sizes (gate widths) of the current source transistors Wn0 through Wn6 are also successively reduced.

When the current source transistors have such transistor sizes respectively, the switched states of the current source transistors Wp0 through Wp6 and Wn0 through Wn6 in the fixed delay circuits 200-0 through 200-5 are illustrated in FIG. 7 by way of example. N0 through N5 respectively indicate gate signals for the current source transistors Wn0 through Wn5 of the fixed delay circuits 200-0 through 200-5. Gate signals for the current source transistors Wp0 through Wp5 of the fixed delay circuits 200-0 through 200-5 respectively correspond to level signals obtained by inverting the gate signals N0 through N5. They are illustrated as /N0 through /N5 in FIG. 5. According to the set state of FIG. 7, the delay times and the steps thereof increase in the order of the fixed delay circuits 200-0 to 200-5.

According to FIG. 5, the detection circuit 201 has phase comparators 201-0 through 201-5 for respectively comparing the phases of clock signals NFTD0 through NFTD5 different in phase respectively outputted from the fixed delay circuits 200-0 through 200-5 and the phase of the reference clock signal PCLK. The results of comparison by the phase comparators 201-1 through 201-5 are defined as switch control signals M0 through M5 for the current source transistors Wn0 through Wn5 in the variable delay circuit 200-6 and switch control signals /M0 through /M5 for the current source transistors Wp0 through Wp5. The signals M0 through M5 and /M0 through /M5 correspond to signals indicative of the signals 202 in FIG. 1 in detail respectively.

Figure 9A:
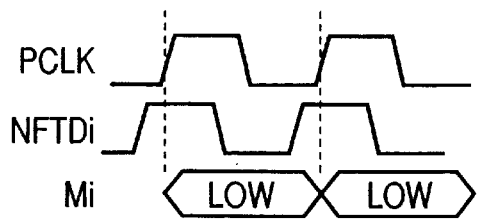
FIGS. 9A and 9B are diagrams for describing operation modes of the phase comparator shown in FIG. 8.

One example of the phase comparators 201-0 through 201-5 is shown in FIG. 8. The phase comparator 201-i (where i=0 to 5) has two two-input NAND gates NAND11 and NAND12 whose one outputs are mutually feedback-connected to the other inputs. If an output NFTDi of a fixed delay circuit 200-i which performs correspondence with timing of the rising edge of a reference clock signal PCLK, is of a high level as shown in FIG. 9A by way of example, then a switch control signal Mi outputted via a clocked inverter CIV11 and a NAND gate NAND13 is brought to a low level. Reversely if the output NFTDi of the fixed delay circuit 200-i, which performs correspondence with the timing of the rising edge of the reference clock signal PCLK, is low in level, then the switch control signal Mi outputted via the clocked inverter CIV11 and the NAND gate NAND13 is brought to a high level.

Figure 9B:
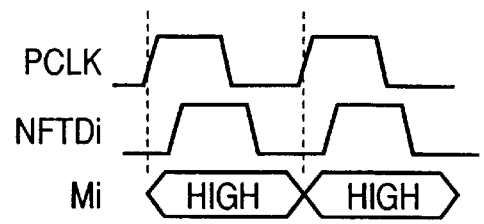

The state of phase shown in FIG. 9A is equivalent to a state in which the amount of a delay of the signal NFTDI is less than one cycle of the reference clock signal PCLK. It is necessary to further increase the delay amount for the purpose of phase synchronization. Further, Mi is set to a low level. Thus, each n channel type current source transistor Wni receiving a signal Mi therein in the variable delay circuit 200-6 is brought to an off state, and each p channel type current source transistor Wpi receiving a signal /Mi therein in the variable delay circuit 200-6 is brought to an off state to thereby increase the amount of a delay of the variable delay circuit 200-6. On the other hand, the state of phase shown in FIG. 9B is equivalent to a state in which the delay amount of the signal NFTDi exceeds one cycle of the reference clock signal PCLK. It is necessary to reduce the delay amount for the purpose of phase synchronization. Mi is set to a high level. Thus, each n channel type current source transistor Wni receiving a signal Mi therein in the variable delay circuit 200-6 is brought to an on state, and each p channel type current source transistor Wpi receiving a signal /Mi therein in the variable delay circuit 200-6 is brought to an on state to thereby decrease the delay amount of the variable delay circuit 200-6.

Figure 10:
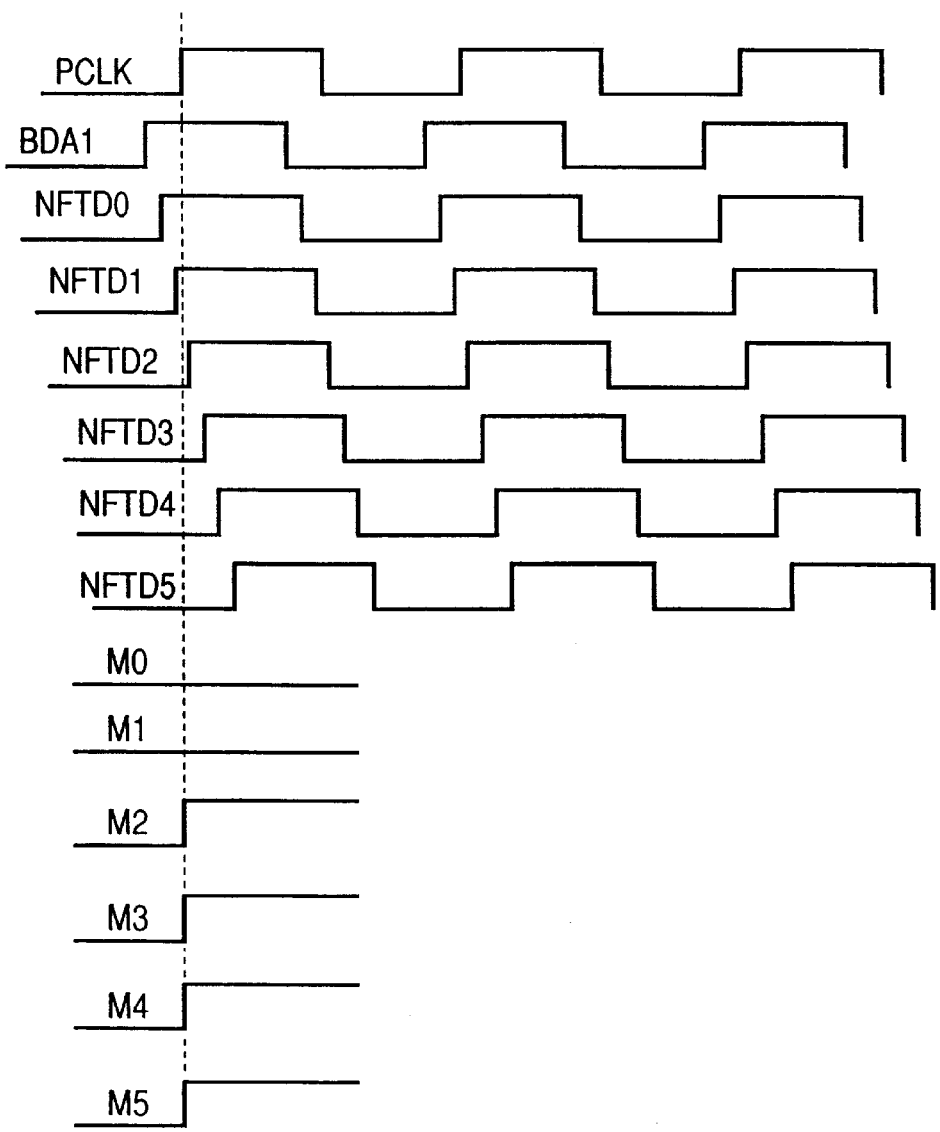
FIG. 10 is a timing chart showing one example illustrative of operating timings provided to perform phase control operations by the fine-control circuit.

FIG. 10 shows one example illustrative of operating timings provided to perform phase control operations by the fine-control circuit 94. Since NFTD0 and NFTD1 are held in the state of FIG. 9A and NFTD2 through NFTD5 are held in the state of FIG. 9B in the example shown in FIG. 10, signals M0, M1, M2, M3, M4 and M5=0, 0, 1, 1, 1, 1. Control signals N0 through N5 for the fixed delay circuit 200-2 for outputting the signal NFTD2 corresponding to the least significant signal M2 set to a logical value "1" (high level) are respectively set to 0, 0, 1, 1, 1, 1 identical to those for the signals M0 through M5 as is apparent from FIG. 7. As is understood from this, the detection circuit 201 generates the same codes as the control signals N0 through N5 for one fixed delay circuit for generating a delay which allows a signal BDA1 to most approximate to the phase state of the reference clock PCLK. Accordingly, the variable delay circuit 200-6 which is comprised of the same transistors as each fixed delay circuit and receives the corresponding codes as signals M0 through M5, can reproduce the same delay as above and gives the reproduced delay to a signal BDA2, thereby making it possible to generate a signal SDCLK.

In FIG. 8, the output of the NAND gate NAND12 is latched into a static latch comprised of a clocked inverter CIV11 for an input gate, a NAND gate NAND13 and a feedback clocked inverter CIV12. The latched signal is defined as the signal Mi. SWCLK indicates a latch control signal. When the latch performs a latch operation each time in synchronism with a reference clock signal PCLK, SWCLK can be regarded as PCLK. Further, when the latch performs the latch operation once per eight cycles, a signal for outputting PCLK once per eight cycles according to a phase comparing operation may be regarded as SWCLKF.

<<Clock Reproducing Operation>>

The operation of the clock reproducing circuit will next be described on the whole. A phase locking operation of the clock reproducing circuit is shown in FIG. 11 from the viewpoint of the distribution of coarse-control and fine-control delay times.

Figure 11:
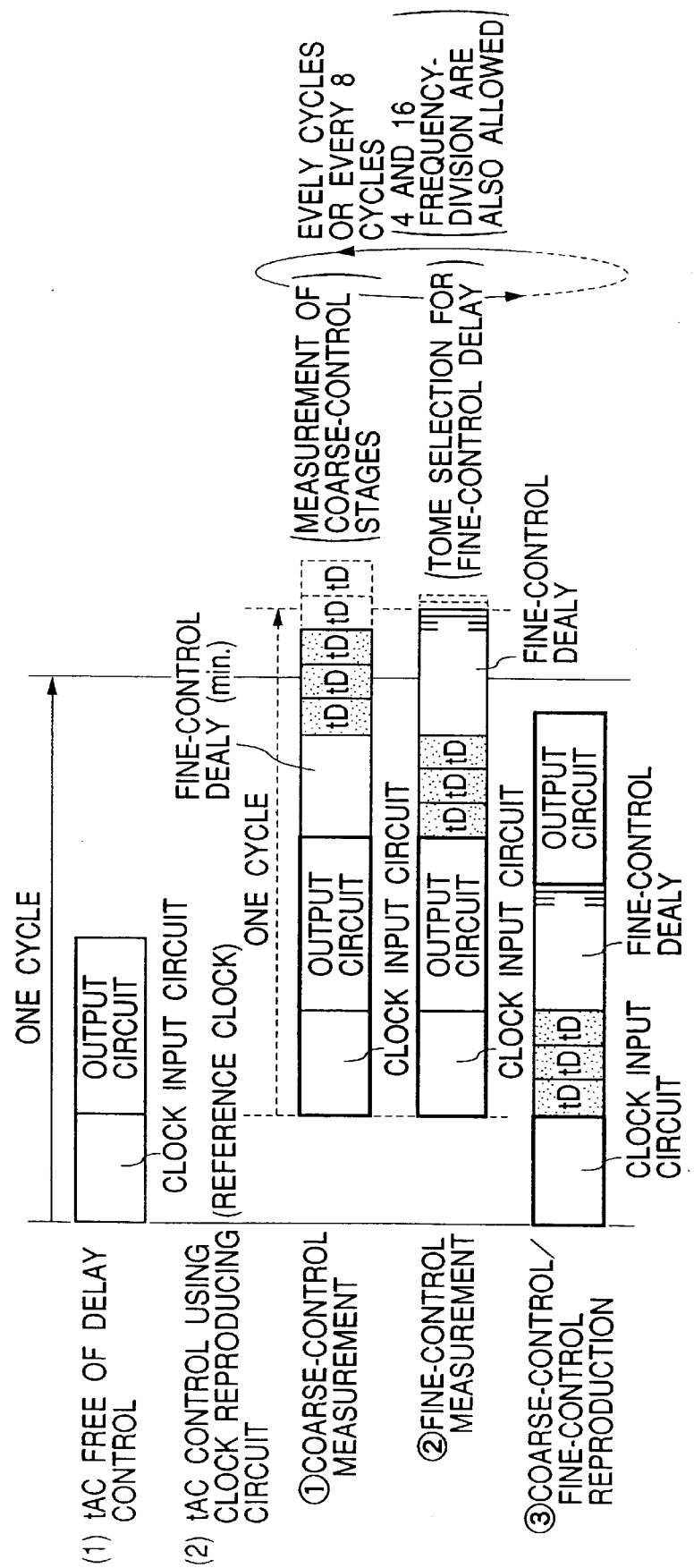
FIG. 11 is an operation explanatory diagram showing phase locking operations executed by the clock reproducing circuit from the viewpoint of the distribution of coarse-control and fine-control delay times.

In FIG. 11, one cycle corresponds to one cycle of an external clock signal EX-CLK. Clock signals such as a reference clock signal PCLK, etc. different from the external clock signal EX-CLK in phase alone also take the same one cycle. An access cycle time at the time that no clock reproduction control is effected on one cycle referred to above, is shorter than the corresponding one cycle. When the frequency of the external clock signal EX-CLK becomes high, the rate of the access cycle time to one cycle also varies. The control of the access cycle time by the use of the clock reproducing circuit 9 allows an access cycle to be identical in phase to the cycle of the external clock signal EX-CLK. The operation of the clock reproducing circuit 9 is roughly divided into three types: ① coarse-control delay measurement (coarse-control measurement), ② fine-control delay measurement (fine-control measurement), and ③ reproduction of coarse-control and fine-control delays (coarse-control/fine-control reproduction).

In FIG. 1, an arrow indicated by ① is affixed to a route or path for the coarse-control measurement, an arrow indicated by ② is attached to a path for the fine-control measurement, and an arrow indicated by ③ is assigned to a path for the coarse-control/fine-control reproduction.

Reference will be made to FIGS. 1 and 11. In the coarse-control measurement of ①, the reference clock signal PCLK is caused to pass through the tAC system replica circuit 91 to thereby virtually give an operation delay of the clock input circuit 2 and an operation delay of the output circuit 10 to the reference clock signal PCLK. The minute delay circuit 92 further assigns delay times obtained when, for example, all the transistors Wp0 through Wp6 and Wn0 through Wn6 in the variable delay circuit 200-6 are turned on, to the output of the tAC system replica circuit 91. A difference in phase between the output of the minute delay circuit 92 and the reference clock signal PCLK is detected by the phase difference detection circuit 100. The detected phase difference corresponds to a delay time equivalent to an integral multiple of a delay time (unit delay time tD) developed by each unit delay circuit 110. This delay time corresponds to a coarse-control delay time. In practice, information about the position of each unit delay circuit for obtaining the coarse-control delay time is obtained by a signal. An error of the delay time developed by each unit delay circuit 110 exists between the sum of the so-accumulated delay times and one cycle of the external clock signal EX-CLK at maximum. Since the phase comparator 111 detects such a previous state that the phase of the output of each unit delay circuit 110 follows the phase of the reference clock signal PCLK (becomes identical in phase thereto) as described above, the sum of the cumulated delay times does not exceed one cycle of the external clock signal EX-CLK.

Also reference will be made to FIGS. 1 and 11. In the fine-control measurement of ②, the first phase difference reproduction circuit 101 generates a signal BDA1 obtained by giving a delay equivalent to the coarse-control delay time to the output of the tAC system replica circuit 91. Further, the fine-control circuit 94 generates information about a fine-control delay time corresponding to the phase difference between the reference clock signal PCLK and the signal BDA1.

In the coarse-control/fine-control reproduction of ③, a signal SDCLK obtained by adding the coarse-control delay time reproduced by the second phase difference reproduction circuit 102 and the fine-control delay time generated by the fine-control circuit 94 to the reference clock signal PCLK is outputted. Accordingly, the clock signal SDCLK outputted with respect to the clock signal DCLK inputted to the clock reproducing circuit 9 is delayed in phase by both the coarse-control delay time and the fine-control delay time. Thus, as is apparent even from the description of ③ in FIG. 11, the output of data DQn from the output circuit 10 and the output of a data strobe signal DQS therefrom are held in phase with the external clock signal EX-CLK when consideration is given to the operation delay time of the clock input circuit 2, which is developed until the input clock signal DCLK is obtained and an operation delay time of the clock buffer 90, which is developed until the reference clock signal PCLK is obtained, and an operation delay time of the output circuit 10, which is developed until the data DQn is outputted in synchronism with a change in clock signal SDCLK. Even if the frequency of the external clock signal EX-CLK is set high, it remains unchanged.

The coarse-control measurement operation of ① may be done each time in synchronism with the reference clock signal PCLK. Alternatively, it may intermittently be carried out every four, eight or sixteen cycles. The result of coarse-control measurement may be latched in the latch circuit 130 according to the latch signal SWCLKC for every their operation cycles. The fine-control measurement of ② may be performed in the next cycle of the coarse-control measurement. The result of fine-control measurement may be latched in the static latch lying within each of the phase comparators 200-1 through 200-5 according the latch signal SWCLKF for each operation cycle thereof. The coarse-control/fine-control reproducing operation of ③ may be done in the next one cycle of the fine-control measurement. Thus, the clock reproducing circuit 9 allows its output operation to be held in phase with the external clock signal EX-CLK after three cycles since it is capable of operation by the release of its standby state, etc.

Figure 12:
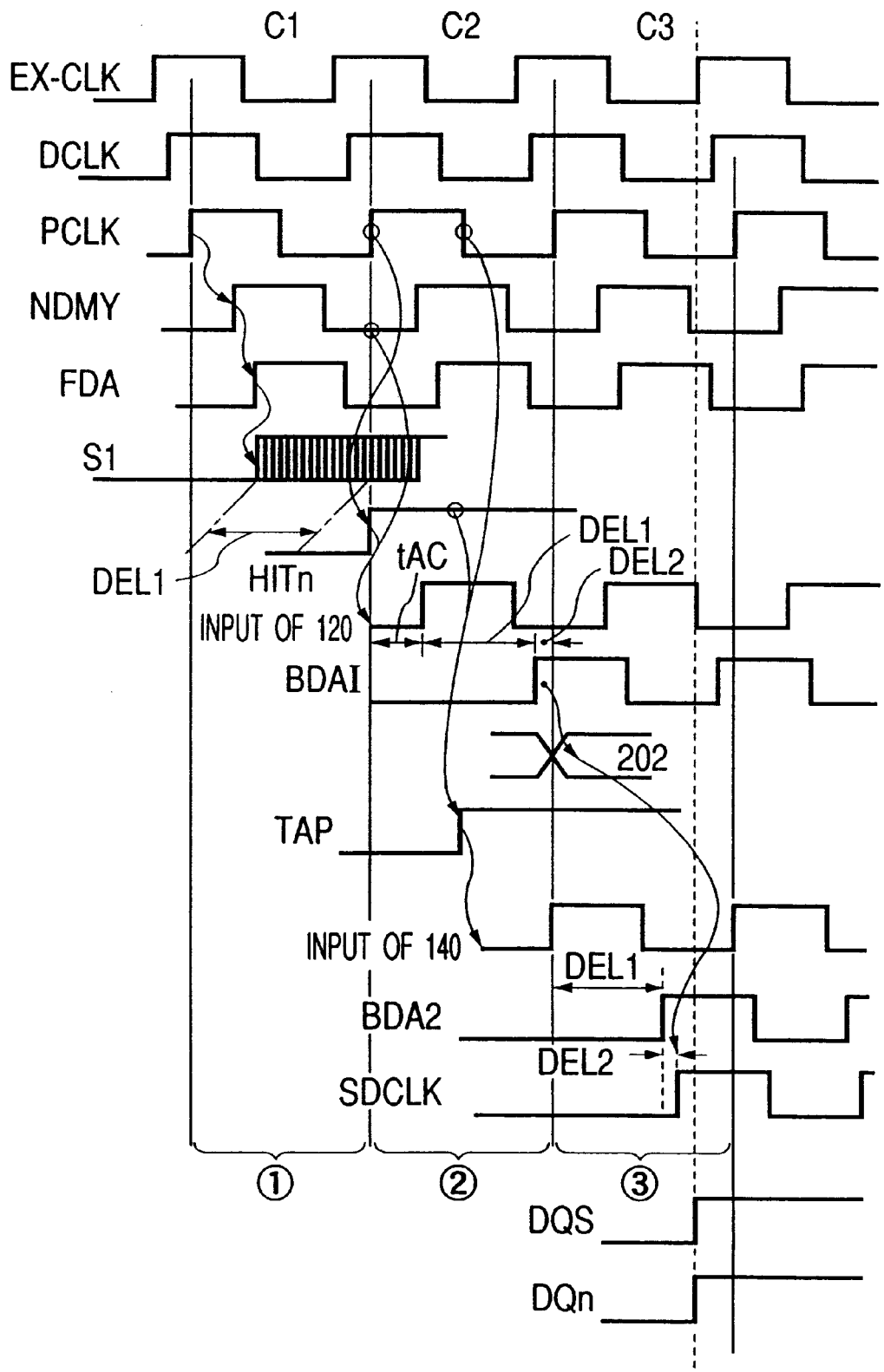
FIG. 12 is a timing chart showing one example illustrative of timings provided to perform phase locking operations by the clock reproducing circuit.

One example illustrative of timings provided to perform phase locking operations by the clock reproducing circuit is shown in FIG. 12. In FIG. 12, S1 is a signal showing the manner in which the output FDA of the minute delay circuit 92 is transferred to each unit delay circuit 110 for each unit delay time tD. A signal HITn is brought to an high level substantially in synchronism with the rising edge of a reference clock signal PCLK. DEL1 having a cycle C1 is a coarse-control delay time. Information about the coarse-control delay time DEL1 is latched in the corresponding latch circuit 130. Further, the coarse-control delay time DEL1 is added to a signal NDMY inputted to each unit delay circuit 120. Thus, the output signal BDA1 of the first phase difference reproduction circuit 101 results in a signal delayed a time tAC and a coarse-control time DEL1 with respect to the reference clock signal PCLK. Further, the signal BDA1 is inputted to the fine-control circuit 94, where a fine-control delay time DEL2 is measured based on the phase difference with respect to the reference clock signal PCLK. DEL2 having a cycle C2 corresponds to a measured fine-control delay time. Information corresponding to the fine-control delay time is latched and supplied to the variable delay circuit 200-6 as signals 202. In a cycle C3, the reference clock signal PCLK is inputted to each unit delay circuit 140 selected in accordance with the information about the coarse-control delay time DELL retained in the latch 130. A signal BDA2 supplied with the coarse-control delay time DELL is produced or formed by the second phase difference reproduction circuit 102. Thereafter, the variable delay circuit 200-6 adds the fine-control delay time DEL2 to the signal BDA2. Thus, a clock signal SDCLK delayed the coarse-control delay time DELL and the fine-control delay time DEL2 with respect to the reference clock signal PCLK is generated in the cycle C3. Accordingly, data DQn and a data strobe signal DQS can be outputted with a state of being kept in phase with the external clock signal EX-CLK.

<<SDRAM>>

Figure 13:
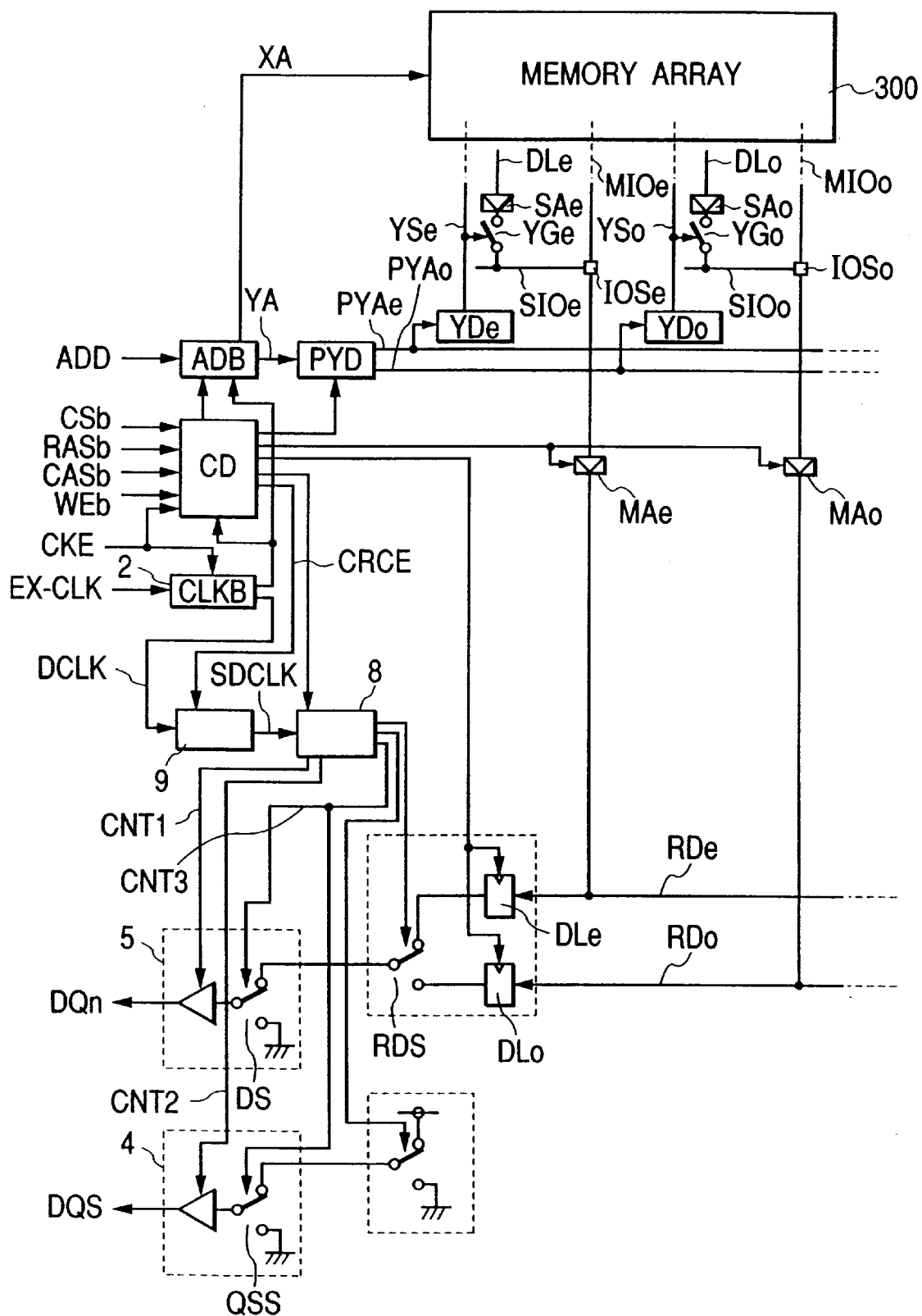
FIG. 13 is a block diagram depicting part of a DDR type SDRAM illustrative of a specific example of a semiconductor device to which the clock reproducing circuit is applied.

FIG. 13 shows a DDR type SDRAM as a specific example of a semiconductor device to which the clock reproducing circuit 9 is applied. Although not restricted in particular, the SDRAM shown in the same drawing is formed over a single semiconductor substrate like monocrystalline silicon by the known semiconductor integrated circuit manufacturing technology. While the SDRAM has a plurality of memory banks, one memory array 300, which typically constitutes one memory bank, is illustrated therein. The memory array 300 has even-number blocks intended for the output of data synchronized with the rising edge of a clock signal and odd-number blocks intended for the output of data synchronized with the falling edge of the clock signal. Each block comprises a plurality of memory mats. The respective blocks are provided with dynamic type memory cells placed in matrix form. Selection terminals of the memory cells arranged in the same row are electrically connected to their corresponding word lines every rows, whereas data input/output terminals of the memory cells arranged in the same column are electrically connected to their corresponding complementary data lines. A complementary data line DLo, a sense amplifier SAo, a Y gate YGo, a common data line SIOo, a Y selection signal YSo, a Y decoder YDo, and a mat selection switch IOSo are provided for each of the mats in the blocks on the even-number side. MIOo is a main data line shared between the respective mats and is electrically connected to a main amplifier MAo. The output of the main amplifier MAo is supplied to a data latch DLo through a read data line RDo. A complementary data line DLe, a sense amplifier SAe, a Y gate YGe, a common data line SIOe, a Y selection signal YSe, a Y decoder YDe, a mat selection switch IOSe are provided similarly even for each of the mats in the blocks on the even number side. A main data line MIOe is a main data line shared between the respective mats and is electrically connected to a main amplifier MAe. The output of the main amplifier MAe is supplied to a data latch DLe through a read data line RDe.

Outputs produced from the data latches DLo and DLe are selected by a selector RDS from which the selected one is outputted to the outside from an output buffer 5. In synchronism with it, a data strobe signal DQS is outputted from a buffer 4.

An external address signal ADD is supplied to an address buffer ADB. An internal X address signal (row address signal) XA is supplied to an unillustrated X address decoder, so that each memory cell is selected via its corresponding unillustrated word line. Information stored in the selected memory cell forms a minute or small potential difference on the corresponding complementary data line. The formed potential difference is amplified by the corresponding sense amplifier. An internal Y address signal (column address signal) YA is supplied to the Y decoders YDe and YDo through a predecoder PYD so that amplified outputs of the sense amplifiers are selected through the Y gates respectively. The so-read data are amplified by the main amplifiers, which in turn are supplied to the data latches, respectively.

The SDRAM is activated in synchronism with an external clock signal EX-CLK. CLKB is a clock buffer which receives the external clock signal EX-CLK therein. A command decoder CD receives a clock enable signal CKE, a chip select signal CSb (where a suffix b means that a signal marked with it is a row enable signal or a level inversion signal), a column address strobe signal CASb, a row address strobe signal RASb, and a write enable signal WE therein and produces or forms internal timing signals for controlling each operation mode of the SDRAM and the operation of the above circuit, based on the levels of these signals and change's timing or the like. A clock buffer CLKB and the command decoder CD regard the clock signal EX-CLK as effective in a state in which the clock enable signal CKE has been asserted. The clock signal EX-CLK is defined as a master clock for the SDRAM, whereas other external input signals are regarded as significant in synchronism with the rising edge of the clock signal CLK.

The chip select signal CSb provides instructions for the start of a command input cycle according to its low level. When the chip select signal is high in level (held in a chip non-selected state), other inputs have no meaning. However, the state of selection of each memory bank to be described later and internal operations such as a burst operation, etc. are not affected by a change to the chip non-selected state.

The respective signals of RASb, CASb and WEb are different in function from their corresponding signals employed in the normal DRAM and are regarded as significant signals when each command cycle is defined.

Next, operation modes of the SDRAM to which instructions are given based on commands, include a row address strobe/bank active command, a column address/read command, etc.

The row address strobe/bank active command is a command for validating the designation of row address strobe and the selection of each memory bank. This command is given or specified based on CSb and RASb=low level and CASb and WEb=high level. At this time, a row address signal and a memory bank selection signal are captured. The capturing operation is done in synchronism with the rising edge of the clock signal as described above. When the corresponding command is specified, for example, a word line for the corresponding memory bank specified by the command is selected and hence memory cells connected to the corresponding word line and their corresponding complementary data lines are brought into conduction.

The column address/read command is a command required to start a burst read operation. Further, the column address/read command is a command for giving instructions for column address strobe. This command is specified according to CSb and CASb=low level and RASb and WEb=high level. At this time, a column address signal is captured. The column address signal captured by this command is supplied to an unillustrated column address counter as a burst start address. Upon the burst read operation specified thereby, the corresponding memory bank and its corresponding word line have been selected in a row address strobe/bank active command cycle before the burst read operation. Memory cells corresponding to the selected word line are successively selected according to an address signal outputted from the column address counter and continuously read out. The number of continuously read data is defined as the number specified by the burst length. The commencement of reading of data from the output buffers 4 and 5 and the output of a data strobe are carried out while the number of cycles in the clock signal CLK defined by CAS latency is being kept waiting. Its control is performed through an output control circuit 8.

Selectors QSS and DS provided within the buffer circuits 4 and 5 are those for meeting preamble-output specifications of the DDR type SDRAM in which data DQn and a data strobe signal DQS are both rendered low in level at the commencement of the data output operation. This is because as explained with reference to FIG. 4, TAPn is allowed to be outputted before the second cycle from the designation of the operation based on the column address/read command according to a signal PREA and a preamble path.

In FIG. 13, control signals CNT1 and CNT2 outputted from the output control circuit 8 are control signals for allowing the buffer circuits 4 and 5 to perform their output operations. When the control signals CNT1 and CNT2 are rendered high in level, for example, the buffers 4 and 5 are capable of performing their output operations. When they are low in level, the output buffers 4 and 5 are respectively brought to a high-output impedance state. A control signal CNT3 is a switch control signal used for the preamble output.

Figure 14:
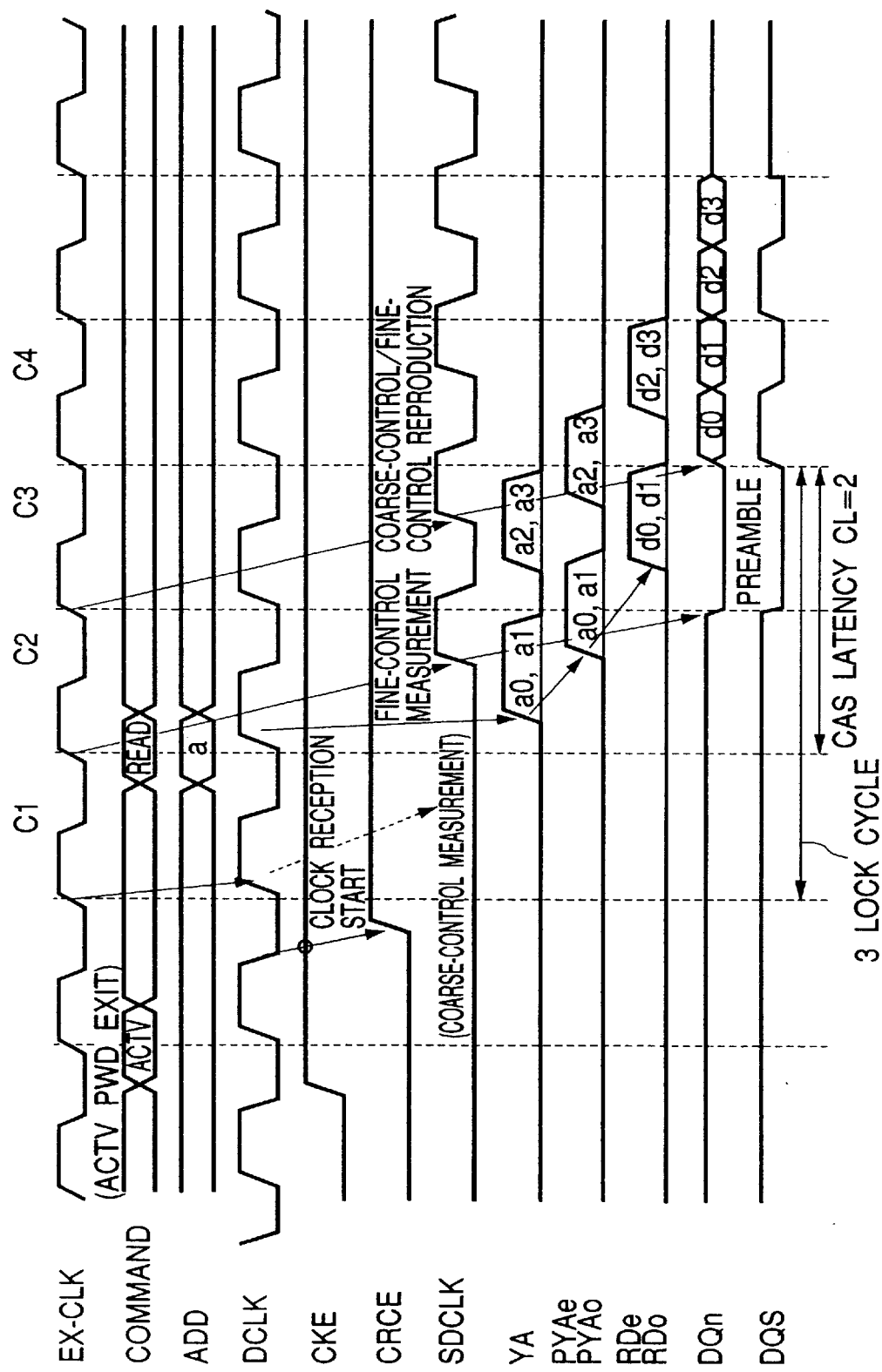
FIG. 14 is a timing chart showing one example of a data reading operation of the SDRAM shown in FIG. 13.

FIG. 14 shows one example of a data reading operation of the SDRAM shown in FIG. 13. The clock enable signal CKE is inverted to a high level so that a power-down mode is released, whereby a row address strobe/bank active command (ACTV) is issued. Thus, a row-system word line selecting operation is started. Along with it, the command decoder CD supplies an enable signal to the clock reproducing circuit 9 in the next cycle, where the clock reproducing operation thereof is started. Next, a column address/read command (READ) is issued to start a column selecting operation. As described above, the clock reproducing circuit 9 is capable of generating a signal SDCLK whose phase locking has been completed in three cycles since the commencement of its operation. That is, the coarse-control measurement, the fine-control measurement, and the coarse-control and fine-control reproduction can be carried out in the cycle C1, cycle C2 and cycle C3 respectively. A lock period used for phase pull-in may be three cycles. The data DQn and the data strobe signal DQS can be successively outputted in synchronism with the clock signal EX-CLK from a cycle C4 up.

Figure 15A:
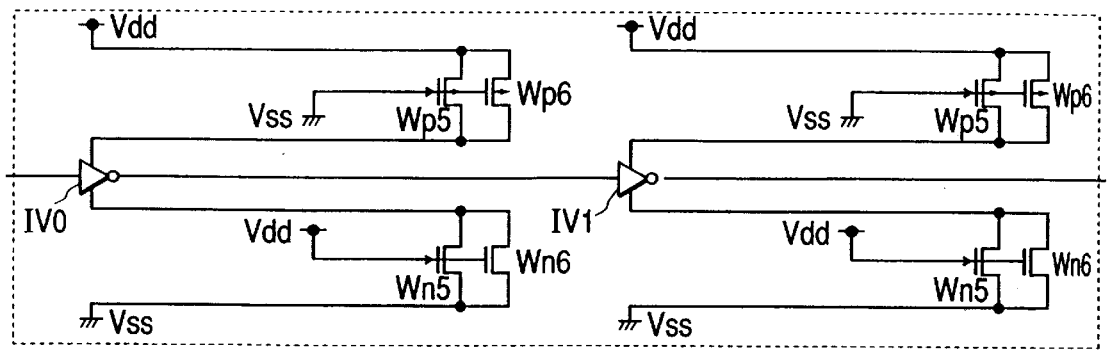
FIGS. 15A, 15B and 15C are respectively explanatory diagrams showing other examples of variable and fixed delay circuits which constitute a fine-control circuit.
Figure 15B:
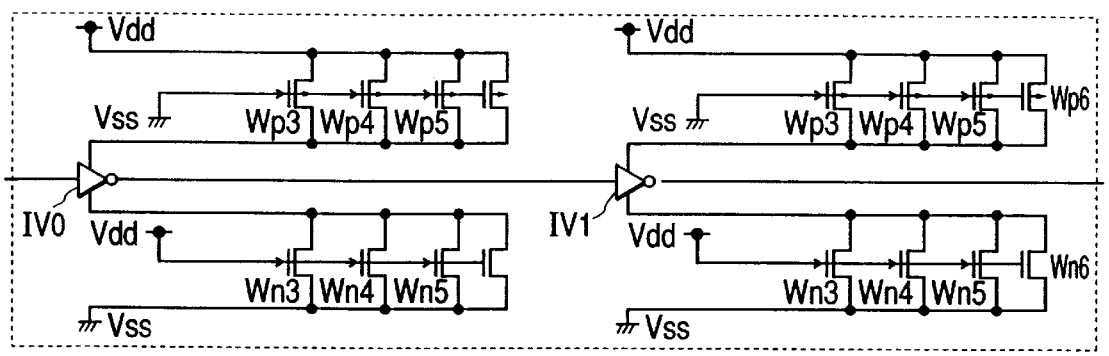
Figure 15C:
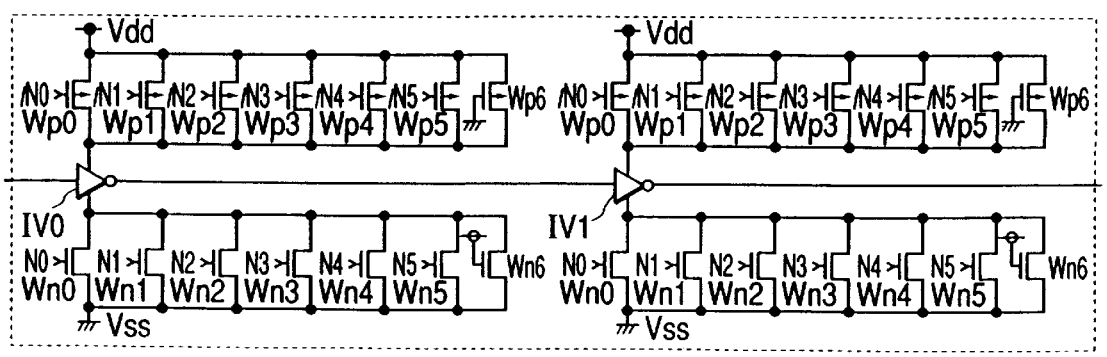

<<Other Examples of Fine-control Circuit>>FIGS. 15A, 15B and 15C respectively show other examples of variable and fixed delay circuits which constitute a fine-control circuit. In the description of FIGS. 5 through 7, the fixed delay circuits 200-0 through 200-5 and the variable delay circuit 200-6 are defined as circuits provided in transistor arrangements identical to one another. Further, transistors different in size are selected in singular or plural form according to the amount of a delay. In the example shown in FIG. 15, the type of size is set to one every p channel type transistors Wp0 through Wp6 and n channel type channel type transistors Wn0 through Wn6 employed in the fixed and variable delay circuits. In the fixed delay circuits, the transistors to be turned on are placed by the required number as illustrated in FIGS. 15A and 15B by way of example to thereby determine a delay time. No turned-off transistors exist in the fixed delay circuits. In the variable delay circuit, as shown in FIG. 15, the selected number of transistors identical in size to one another is determined according to control signals N0 through N5 and /N0 through /N5 to thereby control a delay time.

Although not shown in the drawing in particular, the sizes of the respective transistors employed in the fixed delay circuits and variable delay circuit are made different from one another as described by reference to FIG. 6. The number of transistors to be selected is set as one even in the case of any of the fixed delay circuits and the variable delay circuit. Further, at this time, only the transistors to be turned on are placed in the fixed delay circuits as mentioned in FIGS. 15A, 15B and 15C, and the fixed delay circuits may be configured in such a manner that the transistors kept in the off state do no exist therein.

Further, weights equivalent to 2 to the power are assigned to transistor sizes, and the delay time may be determined according to the type of transistor to be selected.

Figure 16:
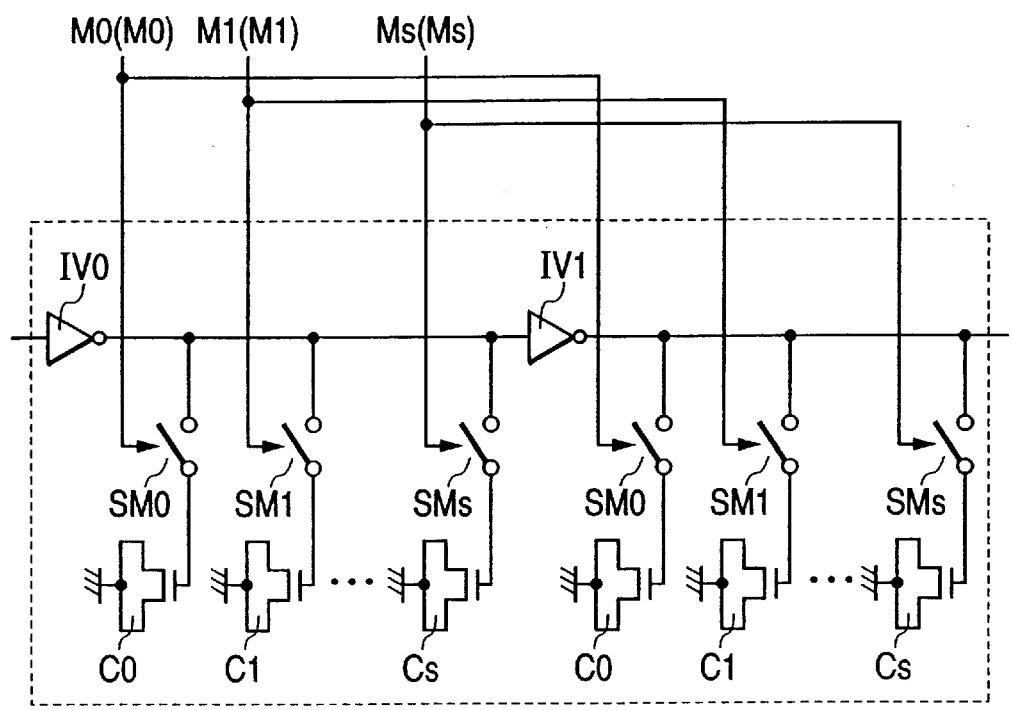
FIG. 16 is a circuit diagram showing an example in which capacitive elements are used to control delay times of a fixed delay circuit and a variable delay circuit.

The fixed delay circuits and the variable delay circuit may be configured so that capacitive elements are used for control of the delay times. As shown in FIG. 16 by way of example, signal transfer paths in the fixed delay circuits and the variable delay circuit are respectively provided with capacitive elements C0 through Cs through switch transistors SM0 through SMs. Selection terminals N0 through Ns of the switch transistors SM0 through SMs for the fixed delay circuits are respectively fixed to a source voltage or a ground voltage according to the required delay times. The plurality of switch transistors SM0 through SMs in the variable delay circuit may be switch-controlled according to the detected signals 202 (M0 through Ms) represented in the form of the plural bits. The capacitance values of the capacitive elements may be identical to one another. Alternatively, they may be varied with predetermined weights. When the capacitance values are identical to each other, the number of the switch transistors SM0 through SMs to be turned on may be changed for every fixed delay circuits in order to obtain delay times different from one another with respect to a plurality of fixed delay circuits FTD0 through FTDs as shown in FIG. 17B by way of example. When each individual capacitance values differ from one another, the number of the switch transistors to be turned on is defined as one as shown in FIG. 17A by way of example. The switch transistors to be turned on may be changed every fixed delay circuits FTD0 through FTDs.

Figure 18:
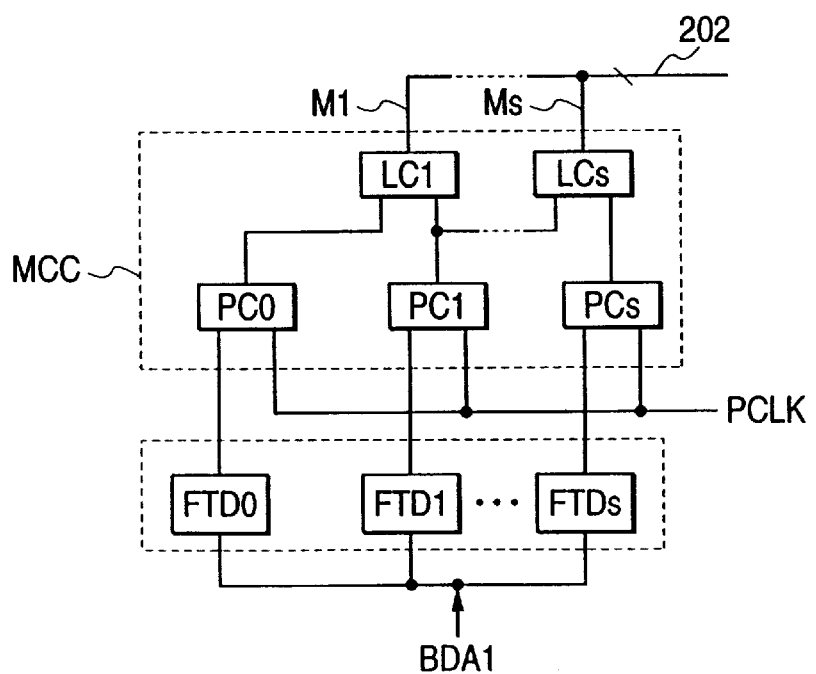
FIG. 18 is a block diagram showing another example of a phase comparing/logical-operating circuit for controlling the number of transistors to be turned on, of a plurality of transistors for controlling a delay time of a variable delay circuit.

When the capacitive elements are used, the switch transistors must be turned on to obtain each delay in contrast with the use of resistors. In other words, the state in which all the switch transistors are turned off, can be selected in a set state in which the delay time is reduced to the minimum. Thus, when the number of the fixed delay circuits is n, the variable delay circuit can be controlled based on a phase comparison signal represented in an n−1 bit. MCC shown in FIG. 18 can be adopted as a phase comparison circuit in this case. In the MMC, phase comparators PC0 through PCs respectively first compare phase differences between the outputs of the fixed delay circuits FTD0 through FTDs, which generate the delay times different from one another, and the reference clock signal PCLK. Next, the selection signals M1 through Ms for the switch transistors in the variable delay circuit are generated from the outputs of PC (t−1) and PCt via logical operation circuits LCt (where t=1 to s) to thereby control the number of switch transistors to be turned on. If an MCC is used wherein LC1 through LCs respectively generate complementary selection signals M1 through Ms and /M1 through /Ms (symbol / means the inversion of logic), then the number of transistors to be turned on can be also controlled in a variable delay circuit using current source transistors. If each phase comparator PC in the above-described circuit MMC is comprised of NAND gates NAND3 and NAND4 as shown in FIG. 4 and each logical operation circuit LC is comprised of NOR gates NOR1 and NOR2 and clocked inverters CIV1 and CIV2 as shown in FIG. 4, then decoding logic for setting one of selection signals M1 through Ms for switch transistors to a selection level according to the outputs of the fixed delay circuits FTD0 through FTDs, can be implemented by the circuit MMC. A specific circuit configuration of the MMC is not limited to the decoding logic, and a logic configuration similar to that shown in FIG. 8 may be utilized.

According to the semiconductor device 1 or SDRAM to which the above-described clock reproducing circuit 9 is applied, the following operation and effects can be obtained.

[1]
According to the fine-control circuit 94, phase control can be performed with the number of tones or gradations or resolution corresponding to the number of fixed delay circuits by simply using one variable delay circuit 200-6 with respect to the plurality of fixed delay circuits 200-0 through 200-5. Thus, a circuit configuration can be simplified as compared with the case in which SMD and grid-like delay circuits (SQUAD) are used for fine adjustments or control of each delay time. A lock operating time up to phase lock can be shortened as compared with the configuration using PLL or DLL. The accuracy of phase control can be also improved.

[2]
Since the delay times are determined under the control of operating currents of the inverters IV0 and IV1 in the fixed delay circuits and the variable delay circuit, the minimum value of each controllable delay time width can be further reduced as compared with the case in which the delay times are controlled based on the number of series stages of inverters. Even in this point of view, the accuracy of phase control can be improved.

[3]
When the capacitive elements C0 through Cs are used for control of delay times, the number of bits for signals detected by the detection circuit 201 can be reduced as compared with the operating current control.

[4]
Owing to the provision of the detection circuit 201 with a latch (CIV11, CIV12, NAND13), the operation of detecting each phase difference by the detection circuit can be intermittently performed, thus making it possible to contribute to low power consumption.

[5]
A phase adjustment or control width can be made wider owing to the two-stage configuration of the clock reproducing circuit by the coarse-control circuit 93 and the fine-control circuit 94. Since the phase control is done in two stages of coarse control and fine control, a comparatively wide phase adjustment or control range can be ensured even if the number of tones or gradations for adjustments or control by the fine-control circuit 94 comprised of the fixed delay circuits 200-0 through 200-5 and variable delay circuit 200-6 for performing the fine control is reduced. Further, it can be achieved on the small circuit scale as described above.

[6]
The adoption of the SMD configuration into the coarse-control circuit 93 makes it possible to shorten a phase pull-in time.

[7]
If the second predetermined delay circuit 92 like the minute delay circuit is comprised of a circuit having a delay time smaller than the maximum adjustment or control width of each delay time capable of being supplied from the variable delay circuit 200-6, then the control width given by the variable delay circuit 200-6 becomes large and hence an operating band of an external clock signal can be easily widened to the high-frequency side.

[8]
If the first latch circuit 103 for latching a phase difference detected by the phase difference detection circuit 100 and supplying it to the second phase difference reproduction circuit 102, and the second latch circuit (CIV11, CIV12 and NAND13) for latching signals detected by the detection circuit 201 in synchronism with the latch operation of the first latch circuit 103 and supplying the same to the variable delay circuit 200-6 are adopted, then they intermittently perform the operation of detecting each phase difference, thus making it possible to contribute to the achievement of lower power consumption.

[9]
Since the output circuit 10 is capable of outputting a data strobe signal DQS in phase with an external clock signal EX-CLK, the design or the like of a system becomes easier owing to the supply of such a strobe signal DQS to a circuit for obtaining access to the semiconductor device 1.

[10]
According to the SDRAM to which the clock reproducing device 9 is applied, a lock operating time required to synchronize an internal clock with an external clock can be shortened as compared with the configuration using PLL or DLL. Further, a circuit configuration for clock reproduction can be also simplified as compared with the configuration using the SMD and grid-like delay circuits (SQUAD), and power consumption can be reduced. Furthermore, the shortened width of a clock cycle time with an improvement in operating frequency can be also widened.

While the invention achieved above by the present inventors, has been described specifically by the embodiments, the present invention is not necessarily limited to them. It is needless to say that various changes can be made thereto within the scope not departing from the substance thereof.

For example, the external clock signal EX-CLK may be a complementary clock signal. Further, each unit delay circuit may be comprised of other logic gates such as an inverter, a NOR gate, etc. without being limited to the NAND gate configuration shown in FIGS. 3 and 4. Further, the circuit configuration for phase comparison may suitably be changed without being limited to the case where it is implemented by the circuit having the form of connection of the NAND gate-based static latch, which has been described in FIG. 8 or the like. The number of parallel stages of switch transistors in fixed delay circuits and a variable delay circuit is not limited to the example shown in FIG. 5. The number of the stages can be suitably increased or decreased. Further, the present invention is not limited to the application to the DDR type SDRAM and can be widely applied to semiconductor devices such as a single data rate type SDRAM, a clock synchronous SRAM, a microcomputer or a system LSI which makes such a memory on-chip, etc.

Advantageous effects obtained by typical ones of the inventions disclosed in the present application will be described in brief as follows:

A phase control circuit simple in circuit configuration as compared with a configuration using SMD and grid-like delay circuits (SQUAD) for fine adjustments or control of delay times, and a clock reproducing circuit can be implemented.

A phase control circuit capable of generating high-resolution minute delays in the less number of delay stages as compared with the configuration using the SMD and grid-like delay circuits (SQUAD) for fine control of delay times, and a clock reproducing circuit can be materialized.

A phase control circuit capable of shortening a lock operating time up to phase locking as compared with PLL and DLL, and a clock reproducing circuit can be implemented.

Power consumption of a semiconductor device activated in synchronism with a clock signal can be reduced.

A semiconductor device for performing the input and output of data in synchronism with an external clock signal, which is capable of widening a shortened width of a clock cycle time with an improvement in operating frequency, and a semiconductor memory can be implemented.

We claim:

1. A phase control circuit, comprising:
   a plurality of fixed delay circuits which respectively receive a first clock signal therein and add predetermined delay times different from one another to the input first clock signal;
   a detection circuit which receives clock signals outputted from said plurality of fixed delay circuits and a second clock signal different in phase from the first clock signal therein and generates detected signals represented in a plurality of bits each corresponding to the difference in phase between the second clock signal and the first clock signal; and
   a variable delay circuit which receives the detected signals represented in a plurality of bits outputted from said detection circuit in parallel therein and gives a delay in the phase difference corresponding to said each input detected signal to a third clock signal.

2. The phase control circuit according to claim 1, wherein said fixed delay circuits and said variable delay circuit respectively comprise current control type inverters whose operating currents are determined according to switched states of current source transistors, and
   said variable delay circuit includes the current source transistors in parallel in plural form, said plurality of current source transistors being respectively switch-controlled according to the detected signals represented in the plurality of bits.

3. The phase control circuit according to claim 1, wherein said fixed delay circuits and said variable delay circuit respectively include capacitive elements provided within signal transfer paths through switch transistors and
   said variable delay circuit includes the capacitive elements and switch transistors in parallel in plural form, said plurality of switch transistors being respectively switch-controlled based on the detected signals represented in the plurality of bits.

4. The phase control circuit according to claim 3, further including a latch circuit which latches the detected signals for each period greater than one cycle of the second clock signal and supplies the same to said variable delay circuit.

5. The phase control circuit according to claim 4, wherein said first clock signal is a clock signal obtained by adding first and second delay times to the second clock signal,
   said third clock signal is a clock signal obtained by adding the second delay time to the second clock signal.

6. A semiconductor device, comprising:
   a semiconductor chip including,
      a clock terminal which receives an external clock signal therein;
      a clock input circuit connected to said clock terminal;
      a phase control circuit according to any of claims 1 to 5, which is connected to said clock input circuit;
      a data output circuit connected to said phase control circuit; and
      data terminals which are connected to said data output circuit and used to output data to the outside, and
   wherein the third clock signal is a clock signal delayed a predetermined time with respect to the external clock signal, and
   said data output circuit is a circuit which outputs the data in phase with the external clock signal in synchronism with the signal outputted from the variable delay circuit in said phase control circuit.

7. The semiconductor device according to claim 6, wherein said data output circuit is a circuit capable of outputting a data strobe signal in phase with the external clock signal in synchronism with the signal outputted from the variable delay circuit in said phase control circuit.

8. A semiconductor device, comprising:
   a clock input circuit which receives an external clock signal therein to thereby generate an internal clock signal;
   an internal circuit activated in synchronism with the internal clock signal;
   an output circuit which outputs the result of operation of said internal circuit to the outside; and
   a clock reproducing circuit for matching the phase of output operation by said output circuit with that of the external clock signal,
   said clock reproducing circuit including,
      first and second predetermined delay circuits which respectively add predetermined delay times to a reference clock signal synchronized with the internal clock signal and are connected to each other in series form;

a phase difference detection circuit which detects the difference in phase between the output of said second predetermined delay circuit and the reference clock signal;

a first phase difference reproduction circuit which adds the phase difference detected by said phase difference detection circuit to an output clock signal of said first predetermined delay circuit;

a plurality of fixed delay circuits which respectively receive a first clock signal outputted from said first phase difference reproduction circuit therein and add predetermined delay times different from one another to the input first clock signal;

a detection circuit which receives clock signals outputted from said plurality of fixed delay circuits and the reference clock signal therein and generates detected signals represented in plural bits each corresponding to the difference in phase between the reference clock signal and the first clock signal;

a second phase difference reproduction circuit which adds the phase difference detected by said phase difference detection circuit to the reference clock signal; and a variable delay circuit which receives said detected signals represented in a plurality of bits in parallel from said detection circuit and adds a delay in the phase difference corresponding to said each input detected signal to a clock signal outputted from said second phase difference reproduction circuit; and wherein said output circuit allows the phase of the output operation to coincide with that of the external clock signal in synchronism with a clock signal outputted from said variable delay circuit.

9. The semiconductor device according to claim 8, wherein said first predetermined delay circuit has a signal propagation delay time corresponding to a delay time equal to the sum of an operation delay time during which said clock input circuit generates the internal clock signal from the external clock signal and generates the reference clock signal from the internal clock signal, and an operation delay time during which the output clock signal of said variable delay circuit is inputted to allow said output circuit to perform the output operation.

10. The semiconductor device according to claim 9, wherein said second predetermined delay circuit has a delay time smaller than the maximum control width of a delay time capable of being supplied from said variable delay circuit.

11. The semiconductor device according to claim 10, wherein said phase difference detection circuit is a forward delay circuit for successively propagating the output of said second predetermined delay circuit, which has a plurality of unit delay circuits provided in series form and selects the position of an output of said each unit delay circuit, which most approximates the state of the reference clock signal, said first phase difference reproduction circuit is a first backward delay circuit which has a plurality of unit delay circuits provided in series form in the reverse direction, each having a delay characteristic identical to or substantially identical to that of said forward delay circuit and which selects an input position of each of the unit delay circuits having, at a subsequent stage, the same number of stages as the number of stages of the unit delay circuits each corresponding to the output position selected by said forward delay circuit and adds the output of said first predetermined delay circuit to the selected input position, and said second phase difference reproduction circuit is a second backward delay circuit which has a plurality of unit delay circuits provided in series form in the reverse direction, each having a delay characteristic identical to or substantially identical to that of said forward delay circuit and which selects an input position of each of the unit delay circuits having, at a subsequent stage, the same number of stages as the number of stages of the unit delay circuits each corresponding to the output position selected by said forward delay circuit and adds the reference clock signal to the selected input position.

12. The semiconductor device according to claim 11, wherein said fixed delay circuits and said variable delay circuit respectively comprise current control type inverters whose operating currents are determined according to switched states of current source transistors, and said variable delay circuit includes the current source transistors in parallel in plural form, said plurality of current source transistors being respectively switch-controlled according to the detected signals represented in the plural bits.

13. The semiconductor device according to claim 11, wherein said fixed delay circuits and said variable delay circuit respectively include capacitive elements provided within signal transfer paths through switch transistors and said variable delay circuit includes the capacitive elements and switch transistors in parallel in plural form, said plurality of switch transistors being respectively switch-controlled based on the detected signals represented in the plurality of bits.

14. The semiconductor device according to claim 8, further including a first latch circuit which latches the phase difference detected by said phase difference detection circuit for each period greater than one cycle of the second clock signal and supplies the same to said second phase difference reproduction circuit, and a second latch circuit which latches the detected signals outputted from said detection circuit in synchronism with the latch operation of said first latch circuit and supplies the same to said variable delay circuit.

15. The semiconductor device according to claim 8, wherein said output circuit is a circuit capable of outputting a data strobe signal in phase with the external clock signal in synchronism with a signal outputted from said variable delay circuit in said clock reproducing circuit.

16. A signal generating circuit, comprising:

a control circuit which compares each of a plurality of signals different in change timing from one another with a signal in a predetermined cycle of a reference clock signal to thereby output a detected signal; and an output circuit which outputs a signal corresponding to the reference clock signal, based on the detected signal; and a plurality of delay circuits respectively provided with delay time control units, and wherein each individuals of said plurality of delay circuits are first delay circuits provided within said output circuit, said plurality of other delay circuits excluding said plurality of first delay circuits are a plurality of second delay circuits provided within said control circuit, said plurality of second delay circuits respectively output said plurality of signals different in change timing from one another in response to a common input signal, and each of delay control units of said first delay circuits is variably controlled based on the detected signal.

17. The signal generating circuit according to claim 16, which is included in a semiconductor device, and wherein said semiconductor device includes a clock terminal which receives an external clock signal from outside said semiconductor device, data terminals which output data to the outside of said semiconductor device, and a data output circuit connected to the data terminals, said reference clock signal is a signal corresponding to the external clock signal, and said data output circuit responds to the signal outputted from said output circuit of said signal generating circuit and outputs the data with timing synchronized with the external clock signal.

18. The signal generating circuit according to claim 16, wherein said plurality of delay circuits further include main delay units respectively, and delay times of said respective delay circuits are respectively set by said main delay units and said delay control units.

* * * * *